(12) United States Patent
Pham et al.

(10) Patent No.: US 8,228,102 B1
(45) Date of Patent: Jul. 24, 2012

(54) PHASE-LOCKED LOOP ARCHITECTURE AND CLOCK DISTRIBUTION SYSTEM

(75) Inventors: Tien Duc Pham, San Jose, CA (US); Sergey Shumarayev, Los Altos Hills, CA (US); Richard G. Cliff, Los Altos, CA (US); Tim Tri Hoang, San Jose, CA (US); Weiqi Ding, Fremont, CA (US); Sriram Narayan, Pleasanton, CA (US); Thungoc M. Tran, San Jose, CA (US); Kumara Tharmalingam, San Jose, CA (US)

(73) Assignee: Altera Corporation, San Jose, CA (US)

( * ) Notice: Subject to any disclaimer, the term of this patent is extended or adjusted under 35 U.S.C. 154(b) by 206 days.

(21) Appl. No.: 12/717,062

(22) Filed: Mar. 3, 2010

(51) Int. Cl.
*H03L 7/06* (2006.01)
(52) U.S. Cl. .......................... 327/156; 327/141; 327/147
(58) Field of Classification Search .................. 327/141, 327/144–163; 331/15–17; 375/373–376
See application file for complete search history.

(56) References Cited

U.S. PATENT DOCUMENTS

| | | | |
|---|---|---|---|
| 6,218,876 B1 | 4/2001 | Sung et al. | |
| 6,252,419 B1 | 6/2001 | Sung et al. | |
| 6,292,016 B1 * | 9/2001 | Jefferson et al. | 326/39 |
| 6,867,616 B1 * | 3/2005 | Venkata et al. | 326/41 |
| 7,269,805 B1 * | 9/2007 | Ansari et al. | 716/136 |
| 7,276,936 B1 * | 10/2007 | Hoang et al. | 326/41 |
| 7,616,657 B2 | 11/2009 | Shumarayev et al. | |
| 7,737,751 B1 * | 6/2010 | Lai et al. | 327/292 |
| 7,791,370 B1 * | 9/2010 | Hoang et al. | 326/38 |
| 2001/0000426 A1 | 4/2001 | Sung et al. | |
| 2005/0200390 A1 | 9/2005 | Starr et al. | |

OTHER PUBLICATIONS

"General-Purpose PLLs in Stratix & Stratix GX Devices" Jul. 2005, 56 pages, Altera Corporation.
"Stratix IV GT Transceiver Architecture" Mar. 2009, 33 pages, Altera Corporation.

* cited by examiner

*Primary Examiner* — Lincoln Donovan
*Assistant Examiner* — Brandon S Cole
(74) *Attorney, Agent, or Firm* — Okamoto & Benedicto LLP

(57) ABSTRACT

One embodiment relates to an integrated circuit including a first strip of phase-locked loop (PLL) circuits on a first side of the integrated circuit, and a second strip of PLL circuits on a second side of the integrated circuit which is opposite from the first side. The PLL circuits in the first and second strips may be configured by programming the integrated circuit. Another embodiment relates to an integrated circuit including a plurality of phase-locked loop (PLL) circuits and a plurality of physical media attachment (PMA) triplet modules adjacent to the plurality of PLL circuits. Each PMA triplet module includes first, second and third channels. The first and third channels are arranged for use as receiving channels, and the second channel is arranged to be configurable as either a receiving channel or a clock multiplication unit. Other embodiments and features are also disclosed.

20 Claims, 16 Drawing Sheets

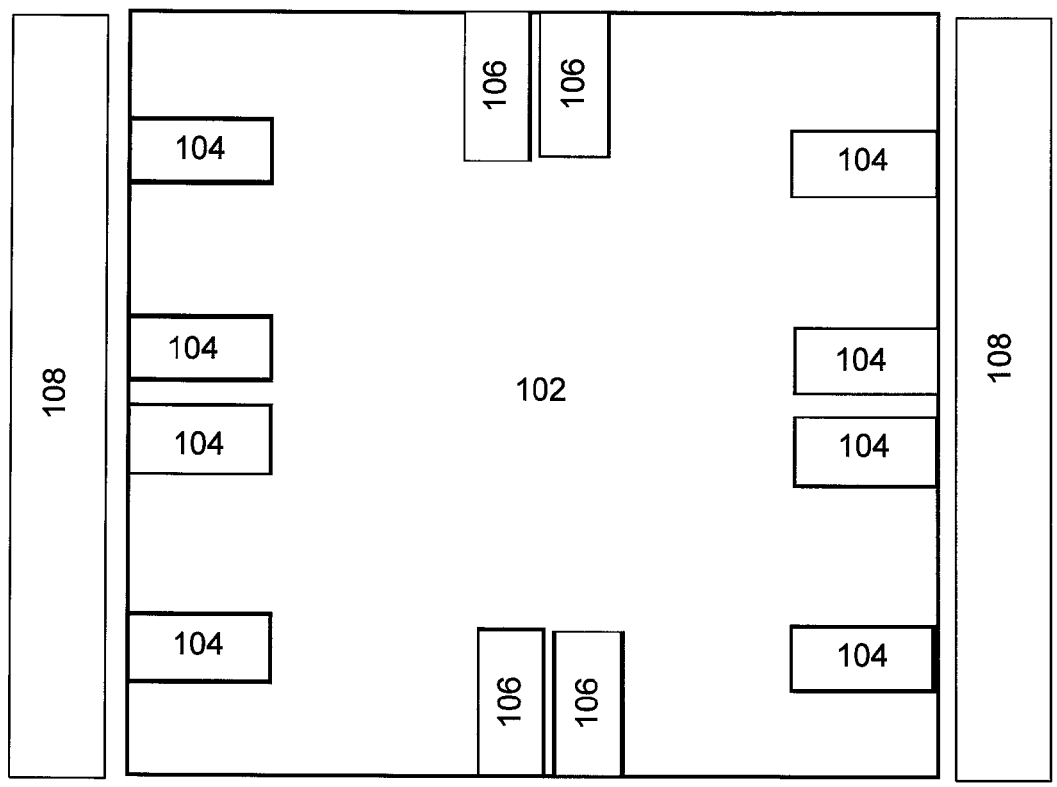
FIG. 1
(Conventional)

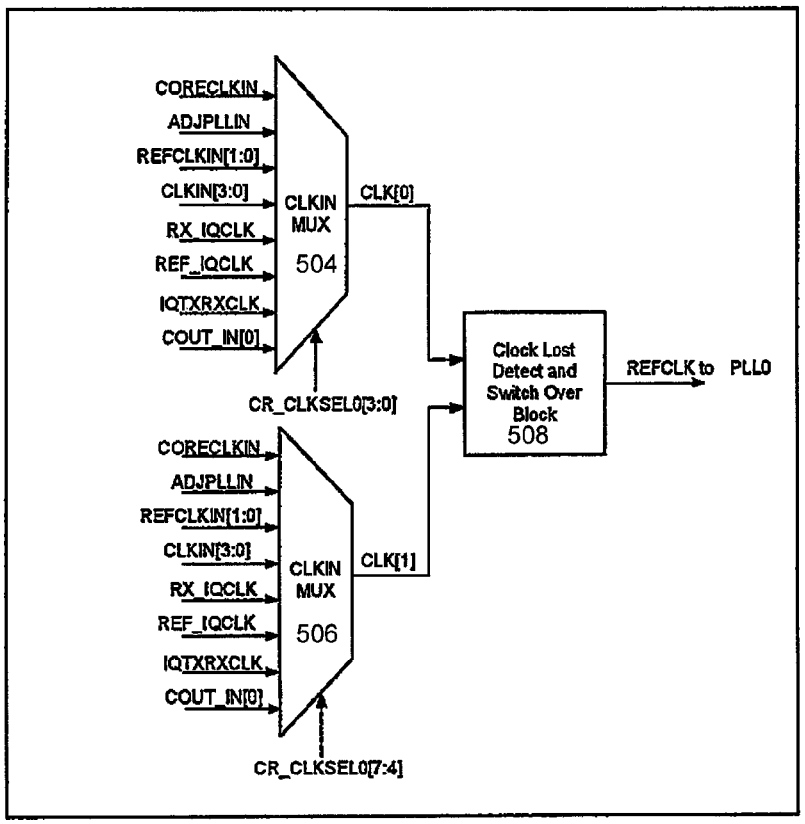
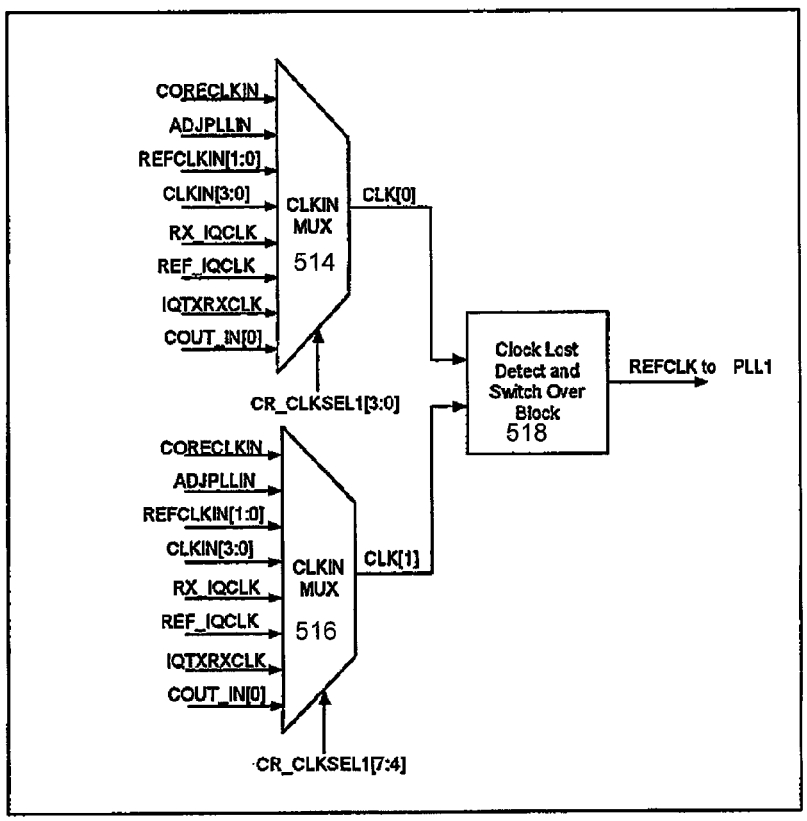
FIG. 5

Previous PMA
"Quad" Module
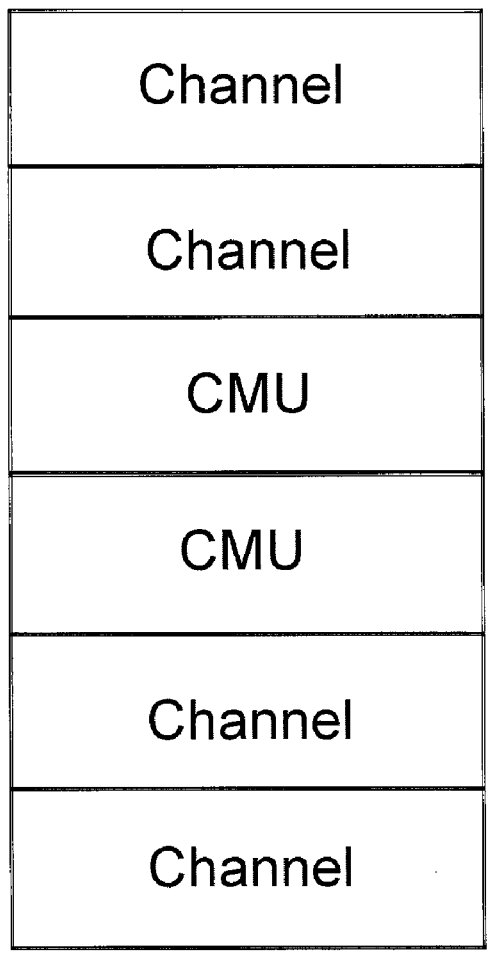
FIG. 9
(Conventional)

|  | X2 | X4 | X8 |
|---|---|---|---|
| channel | unused | ch3 | ch7 |
| channel | unused | ch2 | ch6 |
| CMU | cmu | cmu | unused |
| CMU | unused | unused | unused |
| channel | ch1 | ch1 | ch5 |
| channel | ch0 | ch0 | ch4 |
| channel | unused | ch3 | ch3 |
| channel | unused | ch2 | ch2 |
| CMU | cmu | cmu | cmu |
| CMU | unused | unused | unused |
| channel | ch1 | ch1 | ch1 |
| channel | ch0 | ch0 | ch0 |
| channel | unused | ch3 | ch7 |
| channel | unused | ch2 | ch6 |
| CMU | cmu | cmu | unused |
| CMU | unused | unused | unused |
| channel | ch1 | ch1 | ch5 |
| channel | ch0 | ch0 | ch4 |
| channel | unused | ch3 | ch3 |
| channel | unused | ch2 | ch2 |
| CMU | cmu | cmu | cmu |
| CMU | unused | unused | unused |
| channel | ch1 | ch1 | ch1 |
| channel | ch0 | ch0 | ch0 |
| CMU utilization | 50% | 50% | 25% |
| CH utilization | 50% | 100% | 100% |

FIG. 10
(Conventional)

|  | X2 | X4 | X8 |
|---|---|---|---|
| channel | ch1 | ch3 | ch3 |
| CMU | cmu | unused | unused |
| channel | ch0 | ch2 | ch2 |
| channel | ch1 | ch1 | ch1 |
| CMU | cmu | cmu | cmu |
| channel | ch0 | ch0 | ch0 |
| channel | ch1 | ch3 | ch7 |
| CMU | cmu | unused | ch6 |
| channel | ch0 | ch2 | ch5 |
| channel | ch1 | ch1 | ch4 |
| CMU | cmu | cmu | cmu |
| channel | ch0 | ch0 | ch3 |
| channel | ch1 | ch3 | ch2 |
| CMU | cmu | unused | ch1 |
| channel | ch0 | ch2 | ch0 |
| channel | ch1 | ch1 | ch7 |
| CMU | cmu | cmu | ch6 |
| channel | ch0 | ch0 | ch5 |
| channel | ch1 | ch3 | ch4 |
| CMU | cmu | unused | cmu |
| channel | ch0 | ch2 | ch3 |
| channel | ch1 | ch1 | ch2 |
| CMU | cmu | cmu | ch1 |
| channel | ch0 | ch0 | ch0 |
| CMU utilization | 100% | 50% | 87.50% |
| CH utilization | 100% | 100% | 100% |

PHASE-LOCKED LOOP ARCHITECTURE AND CLOCK DISTRIBUTION SYSTEM

BACKGROUND

1. Technical Field

The present invention relates generally to integrated circuits which include phase-locked loop circuitry and clock distribution systems.

2. Description of the Background Art

A phase-locked loop (PLL) is an electronic circuit with an oscillator. A PLL adjusts the frequency of a feedback signal from the output of the oscillator to match in phase the frequency of an input reference clock signal. Phase-locked loops (PLLs) are an essential building block of many integrated circuits, providing periodic signals for data recovery, data transfer, and other clocking functions.

A PLL may be used to generate a signal, modulate or demodulate a signal, reconstitute a signal with less noise, or multiply or divide a frequency. For example, a PLL may supply a clock signal to one or more counters or dividers that divide a signal from the oscillator to a lower frequency clock signal for distribution around an integrated circuit. In another example, a PLL may be used to stabilize the frequency of a communications channel.

SUMMARY

One embodiment relates to an integrated circuit including a first strip of PLL circuits on a first side of the integrated circuit, and a second strip of PLL circuits on a second side of the integrated circuit which is opposite from the first side.

Another embodiment relates to a method of distributing clock signals in an integrated circuit. A first plurality of clock outputs are generated from a first strip of PLL circuits on a first side of the integrated circuit, and a second plurality of clock outputs from a second strip of PLL circuits on a second side of the integrated circuit. The first and second sides are opposing sides of the integrated circuit. The first plurality of clock outputs are selectively distributed to a first strip of physical media attachment (PMA) circuits on the first side and to core circuitry between the first and second sides. The second plurality of clock outputs are selectively distributed to a second strip of PMA circuits on the second side and to the core circuitry.

Another embodiment relates to an integrated circuit including a plurality of PLL circuits and a plurality of PMA triplet modules adjacent to the plurality of PLL circuits. Each PMA triplet module includes first, second and third channels. The first and third channels are arranged to be used as receiving channels, and the second channel is arranged to be configurable as either a receiving channel or a clock multiplication unit.

Another embodiment relates to a fracture-able PLL circuit. The fracture-able PLL circuit includes a first phase-locked loop circuit generating a first frequency output, a second phase-locked loop circuit; arranged to generate a second frequency output, and a plurality of shared output resources. Reconfigurable circuitry is arranged so that either of the first and second frequency outputs is receivable by each of the plurality of shared output resources.

Another embodiment relates to an integrated circuit which includes a plurality of PMA modules, a plurality of multiple-purpose PLL circuits, and a programmable clock network. Each PMA module includes a plurality of CDR circuits and is arranged to receive a plurality of serial data signals and to output data from those signals in parallel form. The programmable clock network is arranged to allow the clock signals output by the multiple-purpose PLL circuits to be selectively used either by the PMA modules for a transceiver application or by other circuitry for a non-transceiver application.

Another embodiment relates to an integrated circuit which includes a plurality of PMA modules, a plurality of multiple-purpose PLL circuits, a plurality of reference clock signal inputs, and a programmable clock network. Each PMA module include a plurality of CDR circuits and is arranged to receive a plurality of serial data signals and to output data from those signals in parallel form. The programmable clock network is arranged to allow the reference clock signals to be selectively distributed to both the PMA modules and the multiple-purpose PLL circuits.

Other embodiments and features are also disclosed.

BRIEF DESCRIPTION OF THE DRAWINGS

FIG. 1 is a schematic diagram showing a conventional layout for PLLs in an integrated circuit.

FIG. 5 is a diagram depicting clock input circuitry for a fracture-able PLL in accordance with an embodiment of the invention.

FIG. 9 is a diagram depicting a previous PMA "quad" module.

FIG. 10 is a table showing clock multiplication unit (CMU) and receiver channel (CH) utilization using previous PMA quad modules.

FIG. 12 is a table showing CMU and CH utilization using PMA triplet modules in accordance with an embodiment of the invention.

DETAILED DESCRIPTION

Figure 2A:
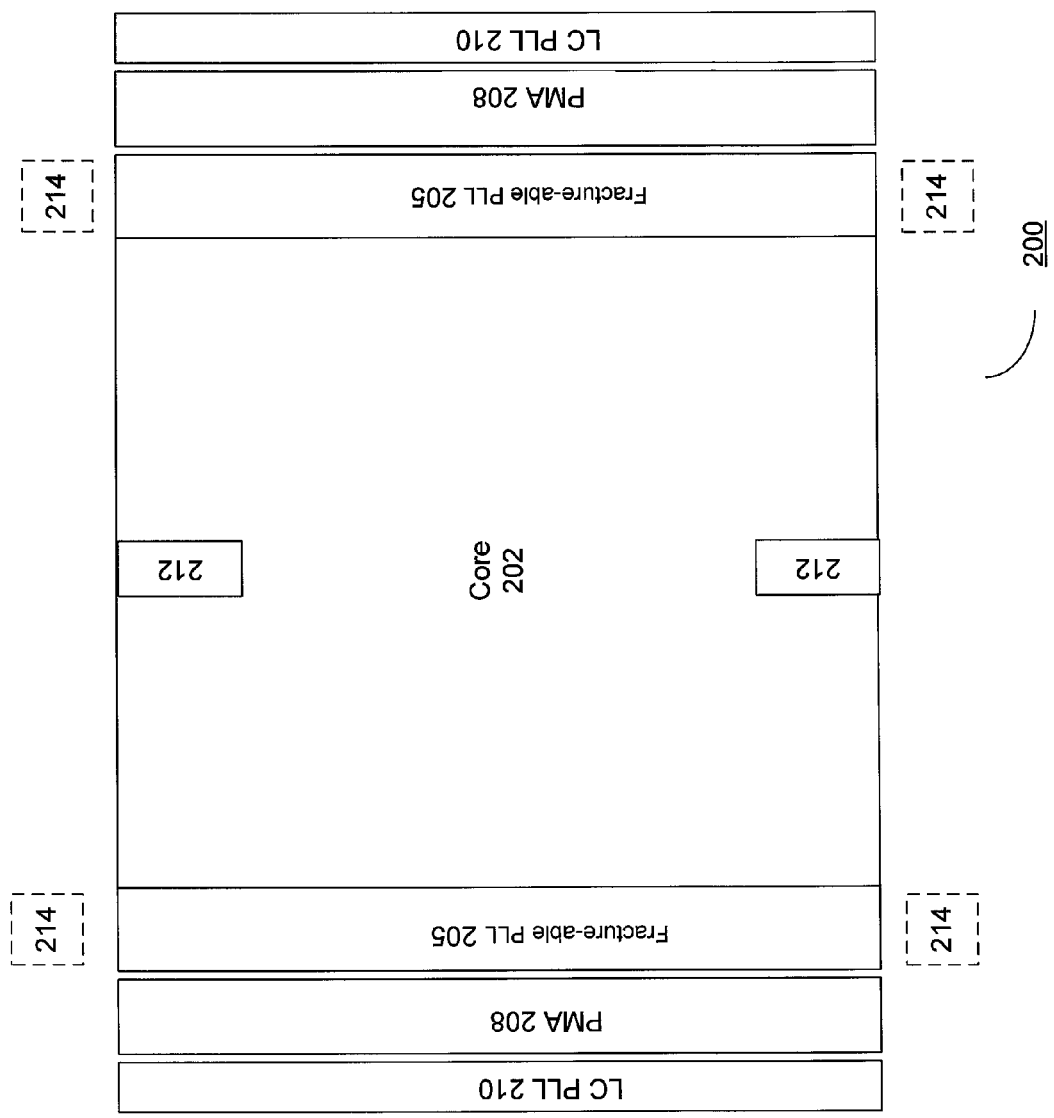
FIG. 2A is a schematic diagram of a layout for PLLs in an integrated circuit in accordance with an embodiment of the invention.

Applicants have determined that conventional PLL architectures have various limitations or drawbacks. One limitation is due to the limited number of PLLs that can be bonded out to the chip packaging. For example, each PLL may typically require bonding to three or four balls (pins) of a ball (pin) grid array package so as to receive power and clock signals. The limited number of balls (pins) available restricts the number of PLLs that may be implemented on the IC chip.

The present application discloses, among other inventive concepts, an advantageous PLL architecture suitable for field programmable gate arrays. Aspects of all of these inventive concepts may also be advantageously applied in application specific integrated circuits, microcontrollers and other integrated circuits, particularly those controllable or programmable by configuration bits (e.g., bits of data locally or remotely stored or generated).

FIG. 1 is a schematic diagram showing a conventional layout (floor plan) 100 for PLLs in an integrated circuit (IC). In this particular case, the IC is a field programmable gate array (FPGA), and the PLLs are general-purpose PLLs. The conventional layout 100 includes, among other features, an FPGA core 102, left/right (L/R) PLL blocks 104, top/bottom (T/B) PLL blocks 106, and physical media attachment (PMA) modules 108.

The FPGA core 102 comprises a two-dimensional array of programmable logic array blocks (or LABs) that are interconnected by a network of column and row interconnect conductors of varying length and speed. Each LAB includes multiple logic elements. A logic element (LE) is a programmable logic block that provides implementation of user-defined logic functions. A programmable interconnect structure interconnects the logic elements and may be programmed to interconnect the logic elements in a multitude of configurations. The FPGA core 102 may also include a distributed memory structure. The distributed memory structure may comprise RAM blocks of varying sizes distributed within the array. Input/output (IO) blocks may be located around the periphery of the IC chip. The FPGA core 102 may also include various other blocks, such as digital signal processing (DSP) blocks, or other functional blocks.

The PLLs in the conventional floor plan 100 of FIG. 1 are distributed along the periphery of the IC chip and include L/R PLLs 104 and T/B PLLs 106. For example, the L/R PLLs 104 may be configured as fast general-purpose PLLs providing general-purpose clock management and supporting the necessary interface timing between the FPGA core 102 and the transmitters in the PMA 108, and the T/B PLLs 106 may be configured as general-purpose PLLs supporting various capabilities such as external feedback, clock switchover, and phase and delay control, for example.

FIG. 2A is a schematic diagram of a layout (floor plan) 200 for PLLs in an integrated circuit (IC) in accordance with an embodiment of the invention. In one particular embodiment, the PLLs are programmable PLLs, and the IC comprises a programmable logic device (PLD) or field programmable gate array (FPGA). The PLLs may be programmed using configuration bits to implement different configurations. The PLD and FPGA are merely examples of the types of integrated circuits that may include embodiments and features of the present invention.

As seen, the layout 200 of FIG. 2A has a fracture-able PLL strip 205, a PMA module strip 208, and a low-jitter clock-generator PLL (LC PLL) strip 210 on both the left and the right sides of the FPGA core 202. In the implementation shown, the fracture-able PLL strips 205 are positioned between the FPGA core 202 and the PMA module strips 208, and the LC PLL strips 210 are positioned adjacent to the PMA module strips 208 on the side away from the core 202. In addition, the layout 200 has top and bottom PLL blocks 212 positioned as shown at the top and bottom edges of the core 202. Furthermore, corner PLL blocks 214 may be optionally included in the layout 200.

Figure 2B:
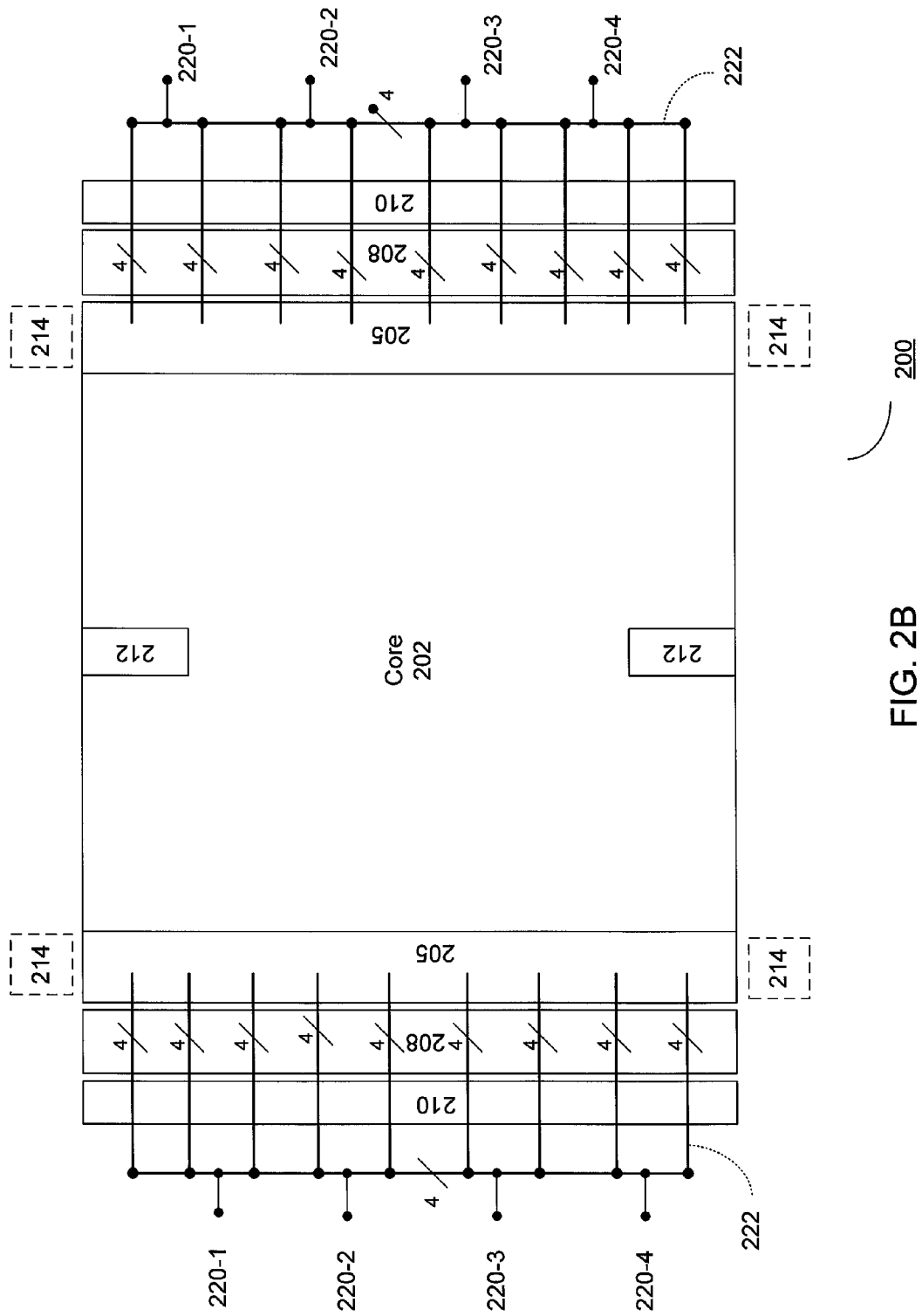
FIG. 2B is a schematic diagram showing a power distribution network for PLLs in an IC in accordance with an embodiment of the invention.

Applicants have determined that this layout (floor plan) 200 provides distinct advantages. One advantage of this layout 200 is that it enables a greater number of PLLs to be implemented on the IC chip. This is because power balls (or pins) may be efficiently shared between multiple PLLs, and clock balls (or pins) may also be efficiently shared between multiple PLLs. An example showing a power distribution network for sharing power from a limited number of power balls (or pins) is depicted in FIG. 2B. As shown in FIG. 2B, multiple power input contacts 220-1, 220-2, 220-3, 220-4 may be on or near the sides of the IC package. Each power input contact is arranged to receive power via one ball or pin of the IC package. Power from the power input contacts may be efficiently distributed to each module or unit in the LC-PLL, PMA, and fracture-able PLL strips (210, 208, and 205) by way of the power distribution network 222. Advantageously, the number of power balls (or pins) needed is reduced compared with the conventional layout 100.

Another advantage of the layout 200 is that common PLL logic may be separated out and shared between multiple PLLs so as to lessen the chip area required to implement the PLLs. Moreover, this layout 200 avoids the need to route over the PLLs which would be required if the PLLs were configured in a column in the center of the IC chip. Further advantages are also provided in view of the following detailed description.

Figure 3:
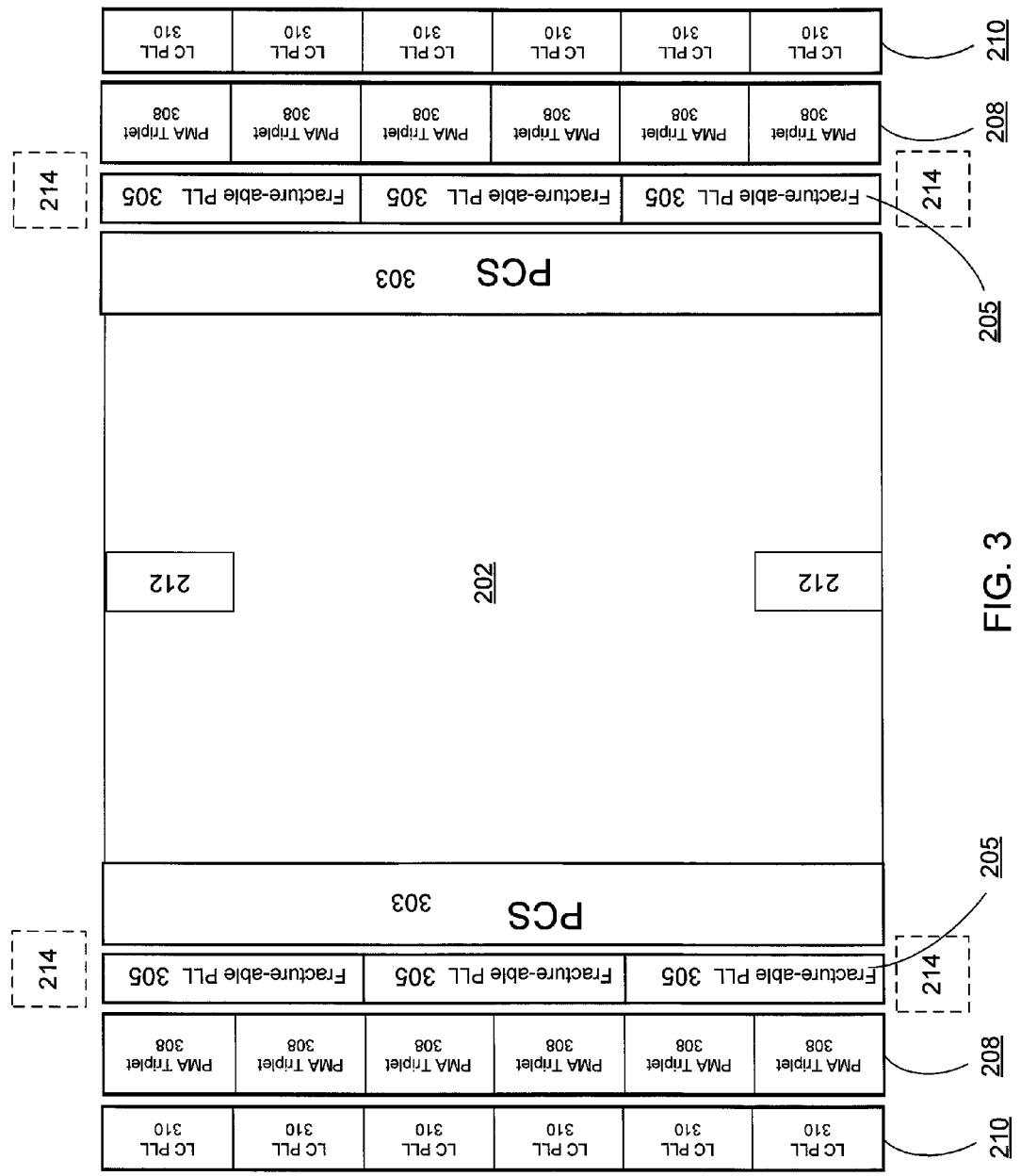
FIG. 3 is a more detailed schematic diagram of a layout for PLLs in an integrated circuit in accordance with an embodiment of the invention.

FIG. 3 is a more detailed schematic diagram of a layout for PLLs in an integrated circuit in accordance with an embodiment of the invention. As shown, the fracture-able PLL strips 205 may each comprise a linear array of fracture-able PLL modules 305, the PMA module strips 208 may each comprise a linear array of PMA "triplet" modules 308, and the LC PLL strips 210 may each comprise a linear array of LC PLL modules 310. An implementation of a PMA triplet module 308 is described further below, for example, in relation to FIG. 11.

As further shown, the modules may be arranged such that there is a pitch of two PMA triplet modules 308 for a single fracture-able PLL module 305, and one LC-PLL 310 for each PMA triplet module 308. In this embodiment, consider that there may be N PMA triplet modules 308 and, hence, N/2 fracture-able PLL modules 305 and N LC PLLs 310, where N is an even-numbered positive integer. For purposes of illustration, N is six in FIG. 3. However, N may be other even-numbered positive integers, such as four, or eight, or ten, or twelve, etc. In other embodiments, the correspondence between the PMA modules and the PLL modules may be different.

Further shown in FIG. 3 are physical coding sublayer (PCS) 303 areas adjacent to the PLL strips 205. The PCS circuitry generally provides digital logic functions which implement data communication protocols, while the PMA circuitry generally provides mixed (analog/digital) signal functionality for the data communications.

For example, for certain protocols, the PCS circuitry may be configured to perform, among other functions, 8-bit (octet) to 10-bit encoding for data to be sent to the PMA circuitry and 10-bit to 8-bit decoding for data received from the PMA circuitry. The PCS circuitry may be arranged into channels, where each channel may process data for a stream of data.

The PMA circuitry may be configured to perform, among other functions, serialization of data to be transmitted (conversion from parallel to serial) and de-serialization of received data (conversion from serial to parallel). The PMA circuitry may also be arranged into channels. For example, the PMA triplet modules 308 are configured to implement three channels.

Figure 4:
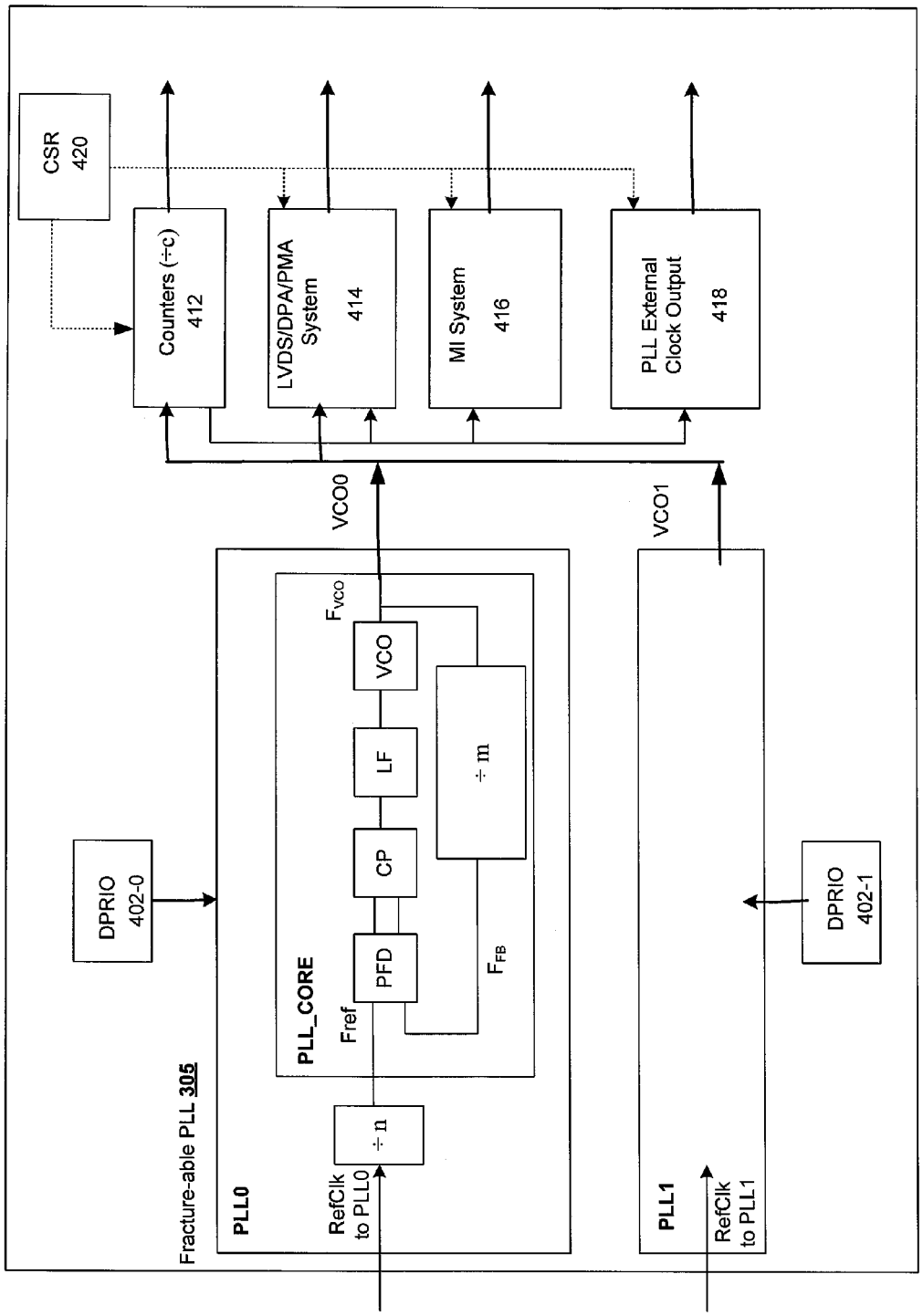
FIG. 4 is a high-level diagram of a fracture-able PLL in accordance with an embodiment of the invention.

FIG. 4 is a high-level diagram of a fracture-able PLL 305 in accordance with an embodiment of the invention. As shown, the fracture-able PLL 305 includes two PLLs and various other circuit blocks.

The two PLLs are labeled as PLL0 and PLL1. For purposes of simplified illustration, circuit details are shown only within PLL0, but PLL1 may be implemented similarly. The circuits within each PLL may include, for example, a pre-scale divide counter (÷n), a PLL core (PLL_CORE), and various other circuits (such as, for example, control circuitry, design-for-test circuitry, compensation circuitry, dynamic phase-shift circuitry, and other circuitry). The pre-scale divide counter for each of PLL0 and PLL1 is arranged to receive an input reference clock (RefClk) and to output a lower-frequency reference clock ($F_{ref}$) which is fed to the PLL core.

The circuits within the PLL core may include, for example, a phase frequency detector (PFD), a charge pump (CP), a loop filter (LF), a voltage-controlled oscillator (VCO), one or more dividers, and other circuits, such as a lock detection circuit. The PFD outputs "up" and "down" signals to the CP. If the CP receives an up signal, current is driven into the LF. If the CP receives a down signal, current is drawn from the LF. The LF effectively converts these signals to a control voltage that is used to bias the VCO. The VCO oscillates at a higher or lower frequency based on the control voltage. This affects the phase and frequency of the feedback clock ($F_{FB}$) which is fed back into the phase frequency detector. A feedback divide counter (÷m) may be inserted into the feedback loop to increase the VCO frequency above the frequency of the reference clock ($F_{ref}$). Each PLL core may include circuitry such that it may be configured as either an integer PLL or a fractional PLL. For example, to implement a fractional PLL, the circuitry may be configured to dynamically change the value m of the feedback divide counter during a locked state. Alternate implementations of the PLL core may be utilized.

The various other circuit blocks may include dynamic partial reconfigurable input/output (DPRIO) circuitry (402) and various output interface blocks. The DPRIO circuitry includes a first DPRIO circuit block 402-0 arranged to control reconfigurable bits in PLL0 and a second DPRIO circuit block 402-1 arranged to control reconfigurable bits in PLL1. The output interface blocks may include, for example, post-scale divide counters (÷c) 412, low voltage differential signal/dynamic phase aligner/physical media attachment (LVDS/DPA/PMA) system circuitry 414, memory interface (MI) system circuitry 416, and PLL external clock output circuitry 418. A configuration shift register (CSR) may be arranged to programmatically configure the counters 412, the LVDS/DPA/PMA system 414, the MI system circuitry 416, and the PLL external clock output circuitry 418. As shown, the outputs of PLL0 (VCO0) and PLL1 (VCO1) may be provided to the counters 412 and to the LVDS/DPA/PMA system circuitry 414. The output from the counters 412 may be provided to the LVDS/DPA/PMA system circuitry 414, the MI system circuitry 416, and the PLL external clock output circuitry 418. Other circuits and signal lines may also be included.

As mentioned above, the clock signals input into PLL0 and PLL1 are denoted RefClk to PLL0 and RefClk to PLL1, respectively. These input clocks may be selected using circuitry, such as depicted in FIG. 5, for example. In FIG. 5, the input clock to PLL0 (RefClk to PLL0) is selected using the upper circuit block 502, and the input clock to PLL1 (RefClk to PLL1) is selected using the lower circuit block 512.

The upper circuit block 502 includes two clock-in multiplexers (CLKIN MUX) 504 and 506 and a clock-lost-detect and switch-over block 508. Each of the clock-in multiplexers 504 and 506 may select one of multiple clock inputs. The multiple clock inputs may be the same for each of the two clock-in multiplexers 504 and 506.

Figure 6:
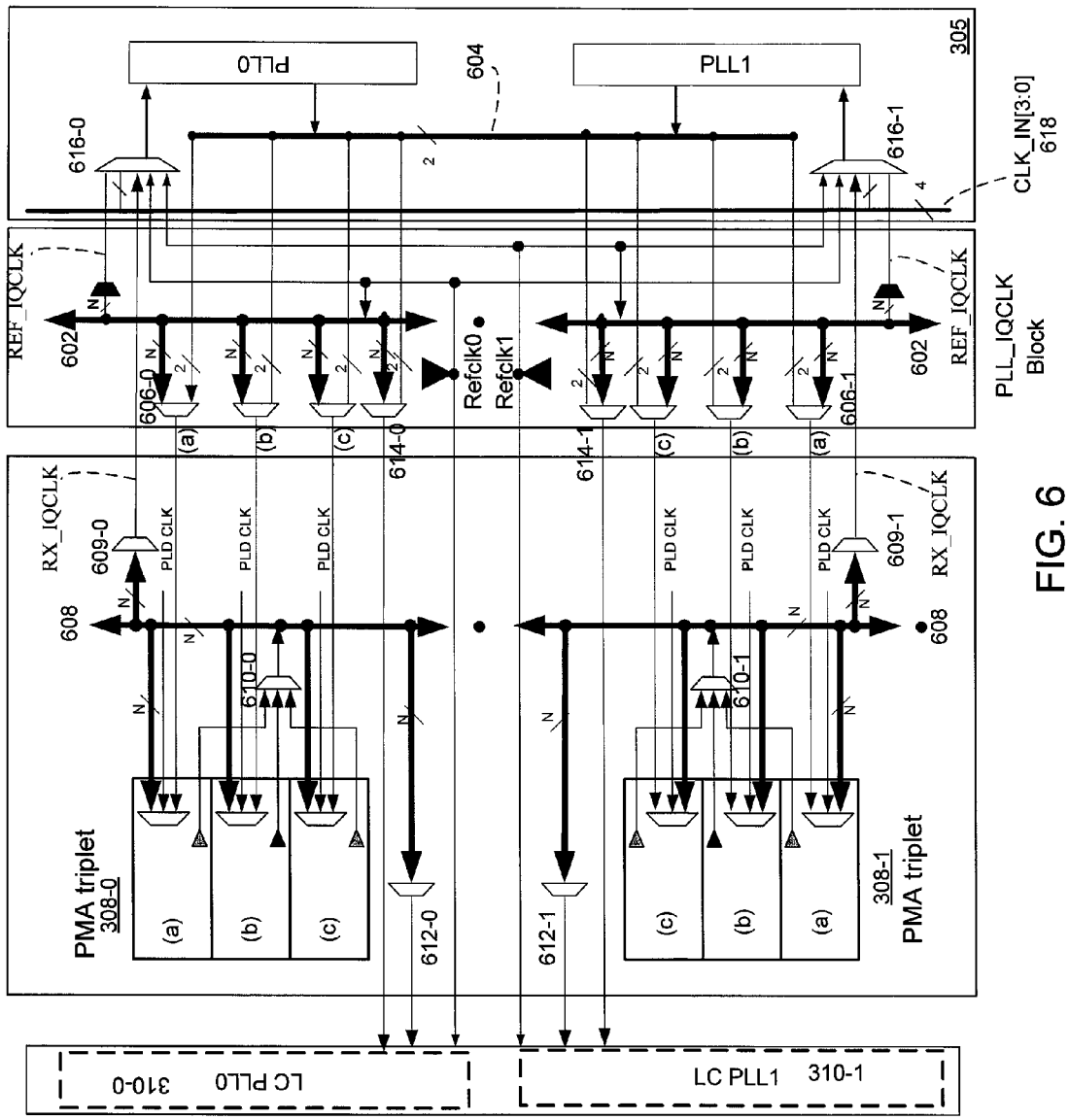
FIG. 6 shows a first programmable clock network interconnecting the fracture-able PLLs, the PMA triplet modules, and low-jitter clock-generator PLLs (LC-PLLs) in accordance with an embodiment of the invention.
Figure 7:
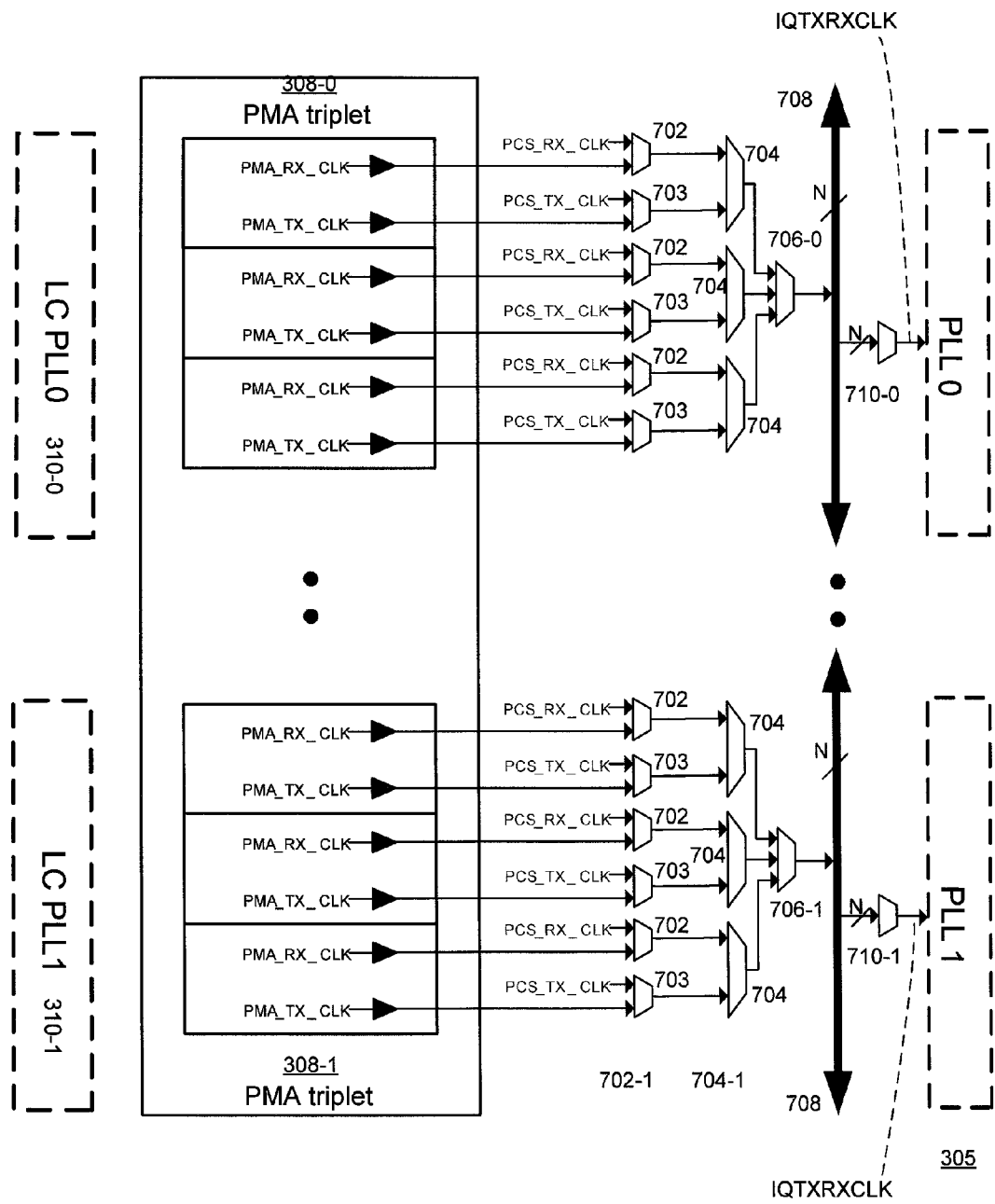
FIG. 7 shows a second programmable clock network connecting the PMA triplet modules to the fracture-able PLLs in accordance with an embodiment of the invention.

The multiple clock inputs may include those from FIGS. 6 and 7. From FIG. 6, the clock inputs may include the REF_IQCLK signal, the CLKIN[3:0] signals, the RX_IQCLK signal, and the REFCLKIN[1:0] (RefClk1 and RefClk0) signals. From FIG. 7, the clock inputs may include the IQTXRXCLK signal. In addition, the clock inputs may include a clock input from the core (CORECLKIN), a clock input from an adjacent PLL (ADJPLLIN), and a clock signal COUT_IN[0] output by one of the post-scale divide counters 412. In other embodiments, different clock inputs may be included.

A first four bits of a first select signal (CR_CLKSEL0[0:3]) may be used to control the selection by the first clock-in multiplexer 504, and a second four bits of the first select signal (CR_CLKSEL0[7:4]) may be used to control the selection by the second clock-in multiplexer 506. The clock-lost-detect and switch-over block 508 may be configured to switch between the clock selected by the first clock-in multiplexer 504 to the clock selected by the second clock-in multiplexer 506, or vice-versa.

Similarly, the lower circuit block 512 includes two clock-in multiplexers (CLKIN MUX 514 and 516) and a clock-lost-detect and switch-over block 518. Each of the clock-in multiplexers 514 and 516 may select one of multiple clock inputs. The multiple clock inputs may be the same for each of the two clock-in multiplexers 514 and 516 and may include the same clock inputs as discussed above in relation to the upper circuit block 502.

A first four bits of a second select signal (CR_CLKSEL1[3:0]) may be used to control the selection by the first clock-in multiplexer 514, and a a second four bits of the second select signal (CR_CLKSEL1[7:4]) may be used to control the selection by the second clock-in multiplexer 516. The clock-lost-detect and switch-over block 518 may be configured to switch between the clock selected by the first clock-in multiplexer 514 to the clock selected by the second clock-in multiplexer 516, or vice-versa.

FIG. 6 shows a first programmable clock network interconnecting the fracture-able PLLs 305, the PMA triplet modules 308, and low-jitter clock-generator PLLs (LC-PLLs) 310 in accordance with an embodiment of the invention.

As seen, the clock network may include a PLL/inverse-quantizer clock (PLL_IQCLK) block arranged in between the fracture-able PLLs 305 and the PMA triplet modules 308. The clock network may be programmed using configuration bits to implement various configurations. Advantageously, this clock network facilitates reference clock sharing between the fracture-able PLLs 305 and the PMA triplet modules 308. The sharing of the reference clocks results in a reduced number of pins (balls) being needed for reference clock inputs to support these circuits.

As shown, the fracture-able PLL 305 includes two PLLs, designated as PLL0 and PLL1. A dedicated PMA reference clock (Refclk) is located next to each PLL, such that there are two reference clocks per fracture-able PLL 305. lines 602 carry N reference clocks, one reference clock per PMA triplet. In accordance with one embodiment of the invention, these reference clocks are located in the fracture-able PLL strip 205 to minimize or reduce jitter in the reference clock signals.

The VCO outputs of PLL0 and PLL1 are provided via two lines 604 to three multiplexers 606-0 (a), (b), and (c) which feed into channels (a), (b), and (c), respectively, of the first PMA triplet 308-0, and are also provided to three multiplexers 606-1 (a), (b), and (c) which feed into channels (a), (b), and (c), respectively, of the second PMA triplet 308-1. Each of the six multiplexers 606 also receives as input the N reference clocks from the N Refclk lines 602. Each of the six multiplexers 606 configurably selects and outputs one signal from the N+2 input signals (the N reference clocks plus the two VCO outputs).

Each channel (a), (b) and (c) of the PMA triplet 308-0 receives the output signal from the corresponding multiplexer 606-0 (a), (b) and (c), respectively. Each channel (a), (b) and (c) of the PMA triplet 308-0 also receives a programmable logic device clock (PLD CLK) and N clock multiplication unit (CMU) clocks from the N CMU lines 608, one CMU clock per PMA triplet in the strip. The PMA triplet 308-0 has a corresponding multiplexer 610-0 which selects a single CMU clock from output signals of the three channels of that triplet.

Similarly, each channel (a), (b) and (c) of the PMA triplet 308-1 receives the output signal from the corresponding multiplexer 606-1 (a), (b) and (c), respectively. Each channel (a), (b) and (c) of the PMA triplet 308-1 also receives a programmable logic device clock (PLD CLK) and N clock multiplication unit (CMU) clocks from the N CMU lines 608, one CMU clock per PMA triplet in the strip. The PMA triplet 308-1 has a corresponding multiplexer 610-1 which selects a single CMU clock from output signals of the three channels of that triplet.

The N CMU clocks signals (one per PMA triplet 308) are thus selected by the N multiplexers 610 and driven onto the N CMU lines 608.

Further shown in FIG. 6 are two low-jitter clock-generator PLLs, LC PLL0 310-0 and LC PLL1 310-1 (one LC PLL 310 per PMA triplet 308). As seen, each LC PLL 310 receives the dedicated reference clock associated with the corresponding PLL. In addition, LC PLL0 310-0 receives a CMU clock selected by a multiplexer 612-0 from the N CMU lines 608 and a reference clock selected by a multiplexer 614-0 from the N Refclk lines 602. Similarly, LC PLL1 310-1 receives a CMU clock selected by a multiplexer 612-1 from the N CMU lines 608 and a reference clock selected by a multiplexer 614-1 from the N Refclk lines 602.

The multiplexer 616-0 for the PLL0 is a simplified depiction of the circuitry used to select a reference clock signal for PLL0 from among several input signals. The input signals include the two dedicated reference clocks (Refclk0 and Refclk1) for that fracture-able PLL 305, a reference clock (REF_IQCLK) selected from the N reference clock lines 602, a CMU clock (RX_IQCLK) selected by multiplexer 609-0 from the N CMU lines 608, and PLL signals from the two neighboring PMA triplets (one above and one below in the strip) via four lines (CLKIN[3:0]) 618.

Similarly, the multiplexer 616-1 for the PLL1 is a simplified depiction of the circuitry used to select a reference clock signal for PLL1 from among several input signals. The input signals include the two dedicated reference clocks (Refclk0 and Refclk1) for that fracture-able PLL 305, a reference clock (REF_IQCLK) selected from the N reference clock lines 602, a CMU clock (RX_IQCLK) selected by multiplexer 609-1 from the N CMU lines 608, and PLL signals from the two neighboring fracture-able PLLs (one above and one below in the strip) via four lines (CLKIN[3:0]) 618.

FIG. 7 shows a second programmable clock network connecting the PMA triplet modules 308 to the fracture-able PLLs 305 in accordance with an embodiment of the invention. The clock network may be programmed using configuration bits to implement various configurations.

In particular, the clock network in this figure has a cascading structure and is advantageously programmable to allow a clock output from each of the N PMA triplet modules 308 (or a clock output from corresponding PCS circuitry) to be selected to drive a corresponding one of the N clock lines 708. It is also programmable to allow each of the N PLLs in the N/2 fracture-able PLLs 305 to be selectively driven by one of the N clock lines 708.

As shown, each channel of PMA triplet modules 308-0 and 308-1 outputs a receive clock (PMA_RX_CLK) to a corresponding RX multiplexer 702 and a transmit clock (PMA_TX_CLK) to a corresponding TX multiplexer 703. In addition, each RX multiplexer 702 receives a receive clock (PCS_RX_CLK) from corresponding PCS circuitry, and each TX multiplexer 703 receives a transmit clock (PCS_TX_CLK) from the corresponding PCS circuitry. Each RX multiplexer 702 configurably selects one of the receive clocks (either PCS_RX_CLK or PMA_RX_CLK), and each TX multiplexer 703 configurably selects one of the two transmit clocks (either PCS_TX_CLK or PMA_TX_CLK).

The selected receive and transmit clocks for each channel are input into a channel multiplexer 704. The channel multiplexer 704 configurably selects for that channel either the selected receive clock from the RX multiplexer 702 or the selected transmit clock from the TX multiplexer 703. The selected clock is the CMU clock for that channel and is input into a multiplexer 706-0 or 706-1 that is associated with that PMA triplet. The multiplexer 706-0 receives a clock for each of the three channels of a PMA triplet module 308-0 and selects one clock to drive an associated line of the N clock lines 708. The multiplexer 706-1 receives a clock for each of the three channels of a PMA triplet module 308-1 and selects one clock to drive an associated line of the N clock lines 708.

One of the N clock lines 708 is selected by the multiplexer 710-0, and that selected clock signal (denoted IQTXRXCLK) is used to drive the adjacent PLL0. Similarly, one of the N clock lines 708 is selected by the multiplexer 710-1, and that selected clock signal (again, denoted IQTXRXCLK) is used to drive the adjacent PLL1.

Figure 8:
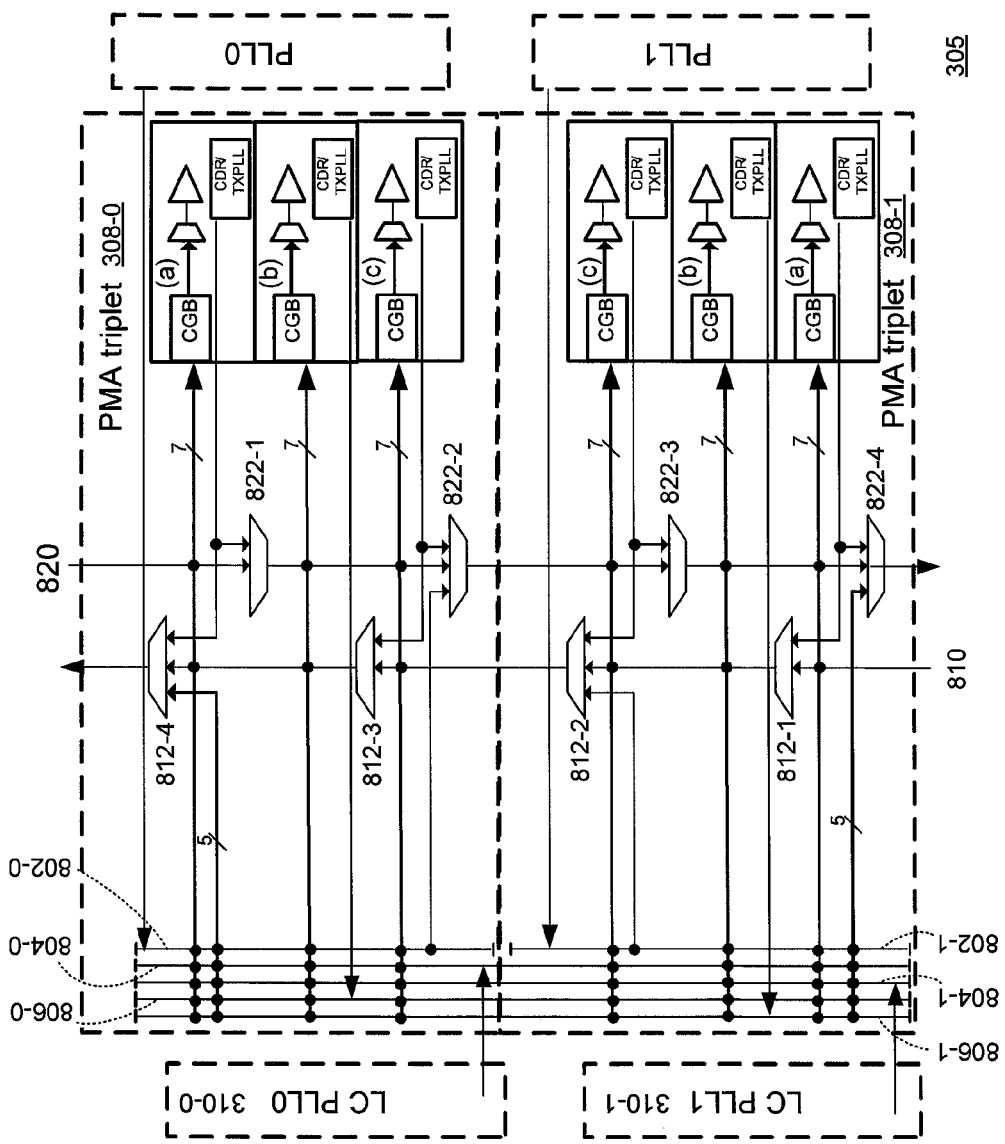
FIG. 8 shows a third programmable clock network which interconnects the fracture-able PLLs, the PMA triplet modules, and the LC PLLs in accordance with an embodiment of the invention.

FIG. 8 shows a third programmable clock network which interconnects the fracture-able PLLs 305, the PMA triplet modules 308, and the LC PLLs 310 in accordance with an embodiment of the invention. The clock network may be programmed using configuration bits to implement various configurations. Advantageously, this clock network is programmable such that each PLL of the fracture-able PLLs 305 may be selectively used as a transmission PLL (TXPLL) of any channel on the adjacent PMA triplet module or on a PMA triplet module which is a neighbor to the adjacent PMA triplet module.

As shown, each channel (a), (b), and (c) of PMA triplet module 308-0 has a clock generation block (CGB). In the implementation shown, each CGB receives seven input signals. Five of the input signals are received from a first group of five lines (802-0, 804-0, 804-1, 806-0 and 806-1). The sixth input signal is received from a first series 810 of multiplexers (812-1, 812-2, 812-3 and 812-4), and the seventh input signal is received from a second series 814 of multiplexers (816-1, 816-2, 816-3 and 816-4). As further shown, in this embodiment, the output signal of each channel each channel (a), (b), and (c) of PMA triplet module 308-0 may be programmed to be obtained from either a clock data recovery (CDR) circuit (when the channel is being used as a receiving channel) or a transmission PLL (TXPLL) (when the channel is being used as a transmitting channel).

Similarly, each channel (a), (b), and (c) of PMA triplet module 308-1 has a CGB which receives seven input signals. Five of the input signals are received from a second group of five lines (802-1, 804-0, 804-1, 806-0 and 806-1). The sixth input signal is received from the first series 810 of multiplexers (812-1, 812-2, 812-3 and 812-4), and the seventh input signal is received from the second series 814 of multiplexers (822-1, 822-2, 822-3 and 822-4). In this embodiment, the output signal of each channel each channel (a), (b), and (c) of PMA triplet module 308-1 may be programmed to be obtained from either a clock data recovery (CDR) circuit (when the channel is being used as a receiving channel) or a transmission PLL (TXPLL) (when the channel is being used as a transmitting channel).

The first group of five lines for PMA triplet 308-0 and the second group of five lines for PMA triplet 308-1 have four lines in common, namely 804-0, 804-1, 806-0 and 806-1. Lines 804-0 and 804-1 are driven by LC PLL0 310-0 and LC PLL1 310-1, respectively. Lines 806-0 and 806-1 are driven by the output signal (from either the CDR or TXPLL) of the middle channel (b) of the PMA triplets 308-0 and 308-1, respectively. The remaining line 802-0 in the first group of lines is driven by PLL0, and the remaining line 802-1 in the second group of lines is driven by PLL1.

The first series 810 of multiplexers includes a first multiplexer (MUX) 812-1, a second MUX 812-2, a third MUX 812-3, and a fourth MUX 812-4. These multiplexers are arranged as follows.

The first MUX 812-1 receives the output signal from an outer channel (a) of the PMA triplet 308-1 and also receives a PLL output signal from a fourth MUX 812-4 in a neighboring PMA triplet 308 which is "below" the PMA triplet 308-1. The first MUX 812-1 configurably selects between these two signals.

The second MUX 812-2 receives the output signal from an inner channel (c) of the PMA triplet 308-1, the output signal from the first MUX 812-1, and a signal from the line 802-1 which driven by fPPL1. The second MUX 812-2 configurably selects between these three signals.

The third MUX 812-3 receives the output signal from an inner channel (c) of the PMA triplet 308-0 and also receives the output signal from the second MUX 812-2. The third MUX 812-3 configurably selects between these two signals.

The fourth MUX 812-4 receives the output signal from an outer channel (a) of the PMA triplet 308-0, the output signal from the third MUX 812-3, a signal from the line 802-0 which driven by fPPL0, a signal from the line 804-0, a signal from line 804-1, a signal from the line 806-0, and a signal from line 806-1. The fourth MUX 812-4 configurably selects between these seven signals. The output signal from the fourth MUX 812-4 is provided to a first MUX 812-1 of a neighboring PMA triplet 308 which is "above" the PMA triplet 308-0 in the strip.

The second series 820 of multiplexers includes a first multiplexer (MUX) 822-1, a second MUX 822-2, a third MUX 822-3, and a fourth MUX 822-4. These multiplexers are arranged as follows.

The first MUX 822-1 receives the output signal from an outer channel (a) of the PMA triplet 308-0 and also receives a PLL output signal from a fourth MUX 822-4 in a neighboring PMA triplet 308 which is "above" the PMA triplet 308-0 in the strip. The first MUX 822-1 configurably selects between these two signals.

The second MUX 822-2 receives the output signal from an inner channel (c) of the PMA triplet 308-0, the output signal from the first MUX 822-1, and a signal from the line 802-0 which driven by fPPL0. The second MUX 822-2 configurably selects between these three signals.

The third MUX 822-3 receives the output signal from an inner channel (c) of the PMA triplet 308-1 and also receives the output signal from the second MUX 822-2. The third MUX 822-3 configurably selects between these two signals.

The fourth MUX 822-4 receives the output signal from an outer channel (a) of the PMA triplet 308-1, the output signal from the third MUX 822-3, a signal from the line 802-1 which driven by fPPL1, a signal from the line 804-0, a signal from line 804-1, a signal from the line 806-0, and a signal from line 806-1. The fourth MUX 822-4 configurably selects between these seven signals. The output signal from the fourth MUX 822-4 is provided to a first MUX 822-1 of a neighboring PMA triplet 308 which is "below" the PMA triplet 308-1 in the strip.

The flexibility of the various configurations possible for the networks is an advantageous aspect of the present invention. As just one example, the network of FIG. 8 may be configured to provide an output frequency signal from PLL0 to channel (a) of PMA triplet 308-0, and the network of FIG. 7 may be configured to provide a feedback frequency signal back from channel (a) of PMA triplet 308-0 to PLL0. A multitude of other configurations may be implemented by appropriate programming of configuration bits that control the various multiplexers and other circuitry.

FIG. 9 is a diagram depicting a previous PMA "quad" module. The PMA quad module includes four receiver channels (CHs) and two clock multiplication units (CMUs). The PMA quad module may be configured to support various bonding modes.

To support a bonding X2 mode which has two receiver channels per transmission channel, two of the four receiver channels are used, and one of the two CMU outputs is selected by a multiplexer prior to being output by a clock generation block. This leaves un-used two receiver channels and one CMU in a PMA quad module.

To support a bonding X4 mode which has four receiver channels per transmission channel, four of the four receiver channels are used, and one of the two CMU outputs is selected by a multiplexer prior to being output by a clock generation block. This leaves un-used only one CMU in a PMA quad module.

To support a bonding X8 mode which has eight receiver channels per transmission channel, two PMA quad modules are used. Eight of the eight receiver channels are used, and one of the four CMU outputs is selected by a multiplexer prior to being output by a clock generation block. This leaves un-used three CMUs in the two PMA quad modules.

FIG. 10 is a table showing clock multiplication unit (CMU) and receiver channel (CH) utilization using four PMA quad modules in a strip. As seen, in the X2 mode, the CMU utilization and the CH utilization are both 50%. In the X4 mode, the CMU utilization is 50%, and the CH utilization is 100%. Finally, in the X8 mode, the CMU utilization is 25%, and the CH utilization is 100%.

Figure 11:
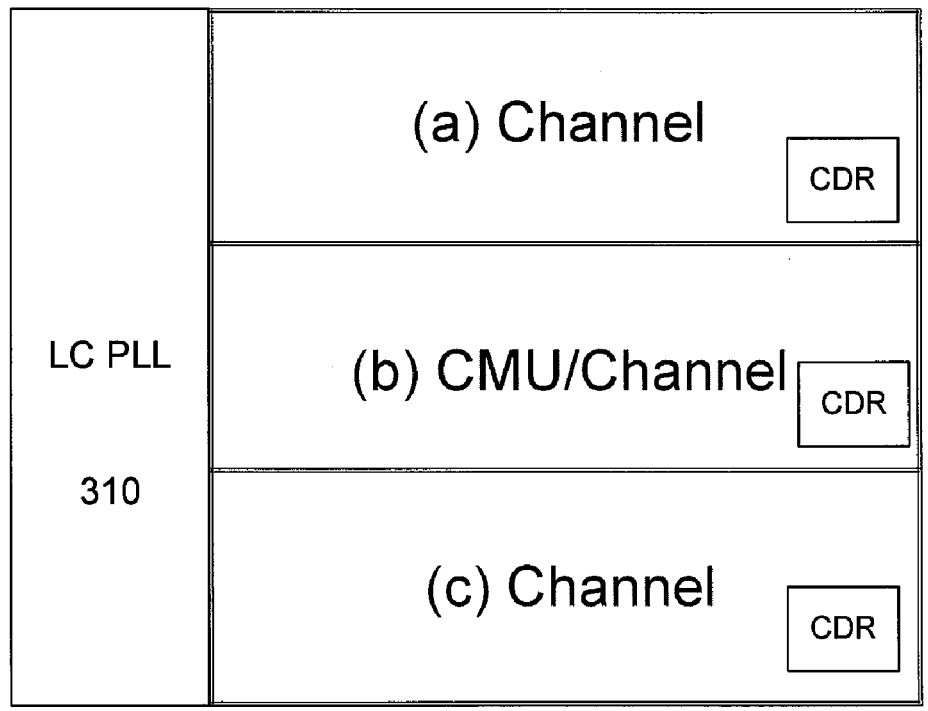
FIG. 11 is a diagram depicting a programmable PMA "triplet" module in accordance with an embodiment of the invention.

FIG. 11 is a diagram depicting a programmable PMA "triplet" module 308 in accordance with an embodiment of the invention. The PMA triplet module 308 is advantageously configurable into three receiver channels, or two receiver channels and a CMU for a transmission channel. In addition, as shown, one LC PLL 310 is provided per PMA triplet module 308.

Each PMA triplet module includes three clock data recovery (CDR) circuits and is arranged to receive three serial data signals, recover a clock signal and data therefrom, and to output the data from those signals in parallel form. As described herein, a programmable clock network is arranged to allow a clock signal output by each PLL in a fracture-able PLL module 305 to be selectively used either by the PMA modules as a transmission PLL (TXPLL) or by other circuitry (in the core, for example) for a non-transceiver application. In one implementation, the PLLs in a fracture-able PLL module 305 have a VCO with an operating frequency sufficiently high to support at least a 3.75 Gbps data rate. This feature advantageously allows the PMA module to support an additional independent channel.

For example, to support a bonding X2 mode which has two receiver channels per transmission channel, the PMA triplet module may be configured as two receiver channels and a CMU.

To support a bonding X4 mode which has four receiver channels per transmission channel, two PMA triplet modules may be used, where each PMA triplet module is configured as two receiver channels and a CMU. In this case, four of the four receiver channels and one of the two CMUs are used. This leaves un-used only one CMU/CH in the two PMA triplet modules.

To support a bonding X8 mode which has eight receiver channels per transmission channel, three PMA quad modules may be used. Here, two PMA triplet modules are configured as three receiver channels, and one PMA triplet module is configured as two receiver channels and a CMU. In this case, eight of the eight receiver channels and the single CMU are used. No receiver channels or CMU/CH is left un-used.

FIG. 12 is a table showing CMU and CH utilization using eight PMA triplet modules 308 in a strip in accordance with an embodiment of the invention. Here, CMU utilization refers to the utilization of the CMU/CH channels which are configurable either into a CMU (for a transmission channel) or into a receiver channel. As seen, in the X2 mode, the CMU utilization and the CH utilization are both 100% for the triplet modules. These utilization rates are both improvements over the previous quad modules.

In the X4 mode, the CMU utilization is 50%, and the CH utilization is 100% for the triplet modules. These utilization rates are the same as for the previous quad modules.

Finally, in the X8 mode, the CMU utilization is 87.5%, and the CH utilization is 100% for the triplet modules. The CMU utilization improves over the 50% CMU utilization of the quad modules. Note that the CMU utilization for the triplet modules would increase to 100% if the number of triplet modules were a multiple of three. However, since there are eight triplet modules in FIG. 12, the top two triplet modules are configured in X4 mode, which leaves one CMU/CH un-used.

Figure 13:
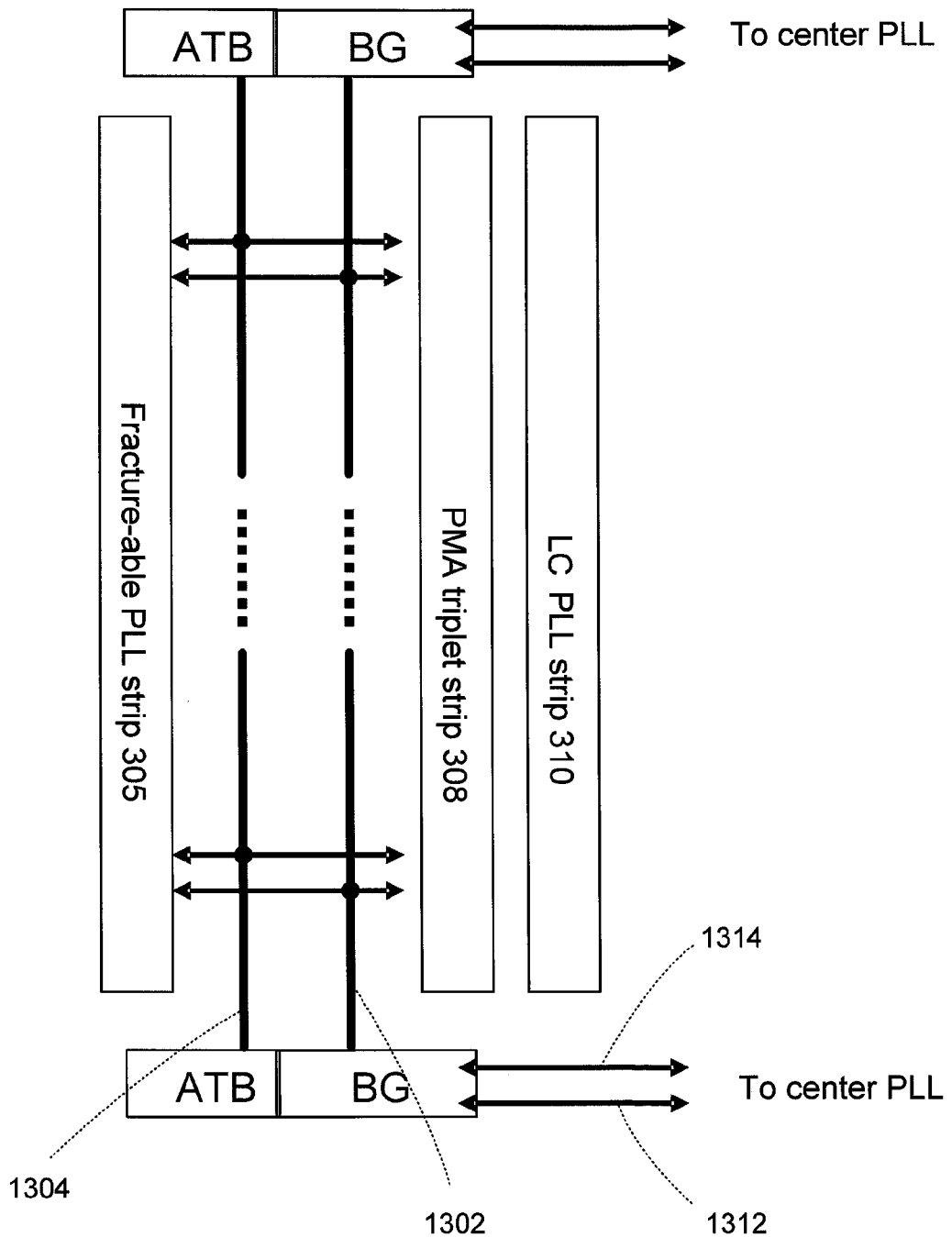
FIG. 13 is a high-level schematic diagram depicting the sharing of band gap (BG) and analog test bus (ATB) circuitry in accordance with an embodiment of the invention.

FIG. 13 is a high-level schematic diagram depicting the sharing of band gap (BG) and analog test bus (ATB) circuitry in accordance with an embodiment of the invention. As shown, the BG and ATB circuitry are advantageously shared by the fracture-able PLL strip 305, the PMA triplet strip 308, and the LC PLL strip (adjacent to the PMA triplet strip). In addition, the BG and ATB circuitry may also support PLLs outside of the strip, such as PLLs 212 which may be provided at the top and bottom edges of the core circuitry 202.

Figure 14:
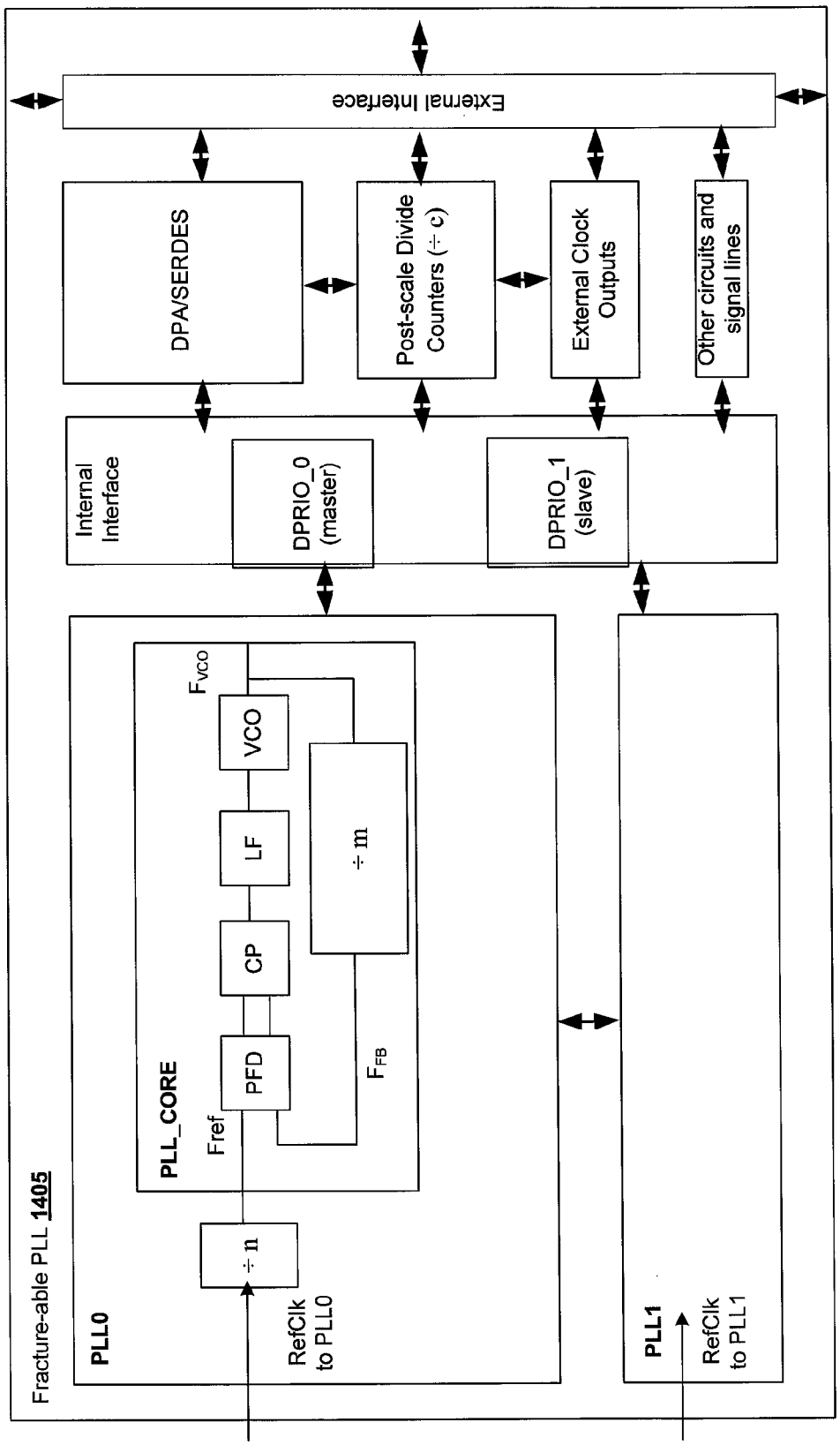
FIG. 14 is a high-level diagram of a fracture-able PLL in accordance with an alternate embodiment of the invention.

FIG. 14 is a high-level diagram of a fracture-able PLL 1405 in accordance with an alternate embodiment of the invention. As shown, the fracture-able PLL 1405 includes two PLLs, an internal interface, an external interface, and various circuits between the internal and external interfaces. In this particular example, the various circuit blocks include dynamic phase aligners/serializer-deserializers (DPA/SERDES), post-scale divide counters (÷ c), external clock outputs, and other circuits and signal lines.

The two PLLs are labeled as PLL0 and PLL1. For purposes of simplified illustration, circuit details are shown only within PLL0, but PLL1 may be implemented similarly. The circuits within each PLL may include, for example, a pre-scale divide counter (÷n), a PLL core (PLL_CORE), and various other circuits (such as, for example, clock input & switch-over circuitry, control circuitry, design-for-test circuitry, compensation circuitry, dynamic phase-shift circuitry, and other circuitry). The pre-scale divide counter may receive an input clock ($F_{in}$) and output a lower frequency reference clock ($F_{ref}$).

The circuits within the PLL core may include, for example, a phase frequency detector (PFD), a charge pump (CP), a loop filter (LF), a voltage-controlled oscillator (VCO), one or more dividers, and other circuits, such as a lock detection circuit. The PFD outputs "up" and "down" signals to the CP. If the CP receives an up signal, current is driven into the LF. If the CP receives a down signal, current is drawn from the LF. The LF effectively converts these signals to a control voltage that is used to bias the VCO. The VCO oscillates at a higher or lower frequency based on the control voltage. This affects the phase and frequency of the feedback clock ($F_{FB}$) which is fed back into the phase frequency detector. A feedback divide counter (÷m) may be inserted into the feedback loop to increase the VCO frequency above the frequency of the reference clock ($F_{ref}$). Each PLL core may include circuitry such that it may be configured as either an integer PLL or a fractional PLL. For example, to implement a fractional PLL, the circuitry may be configured to dynamically change the value m of the feedback divide counter during a locked state. Alternate implementations of the PLL core may be utilized.

Figure 15:
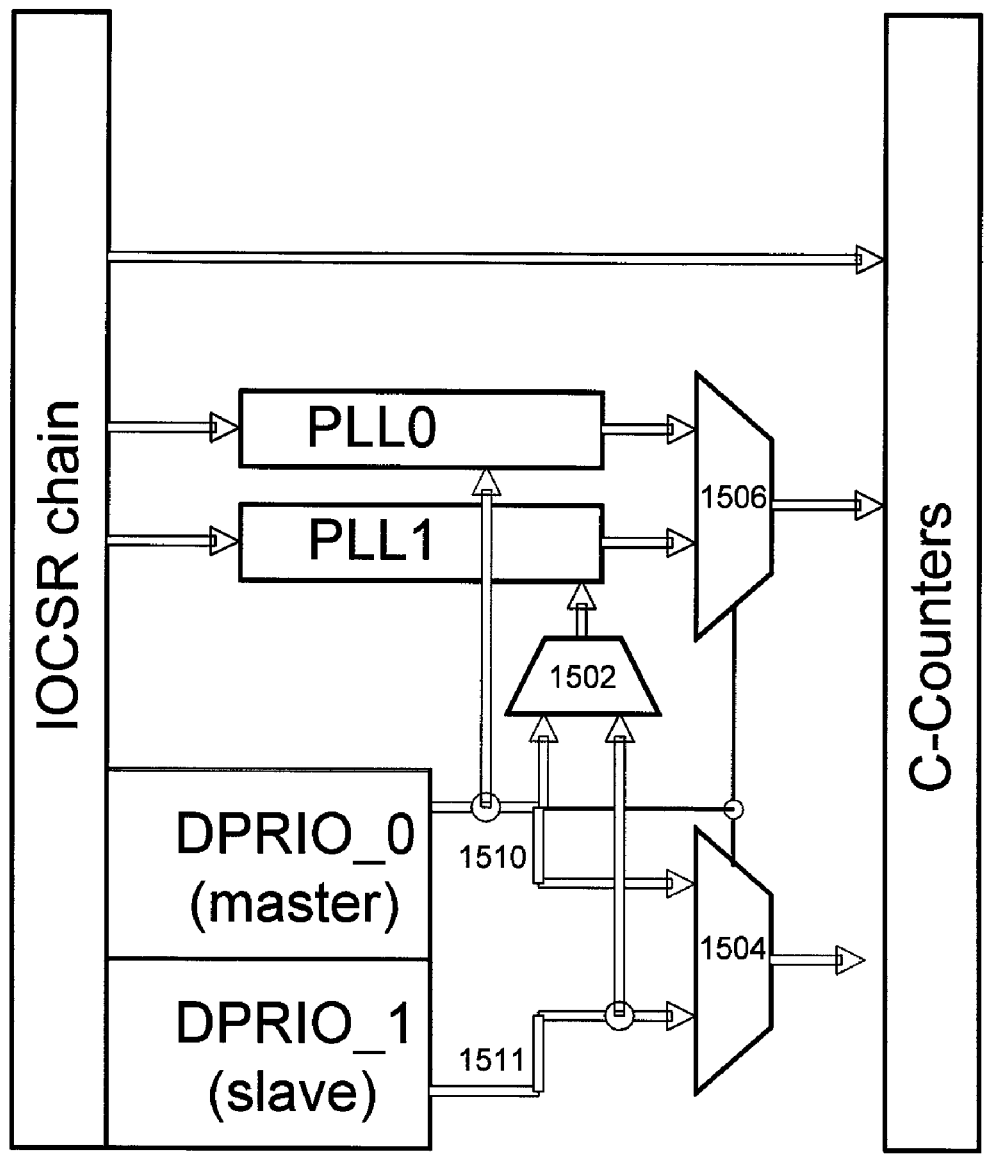
FIG. 15 is a high-level diagram illustrating a master/slave DPRIO structure for a fracture-able PLL in accordance with an alternate embodiment of the invention.

As seen, the Internal Interface may be configured to include dynamic partial reconfigurable input/output (DPRIO) circuitry. In particular, the Internal Interface may include a master DPRIO (DPRIO_0) and a slave DPRIO (DPRIO_1). The master DPRIO may be arranged to control all reconfigurable bits, including those for PLL0, PLL1, and the post-scale divide counters (the C-Counters), while the slave DPRIO may be arranged to control only the reconfigurable bits for PLL1 and the C-Counters. FIG. 15 is a high-level diagram illustrating a master/slave DPRIO structure for a fracture-able PLL in accordance with an alternate embodiment of the invention. In this embodiment, components cooperatively interconnected include an I/O Configuration Shift Register chain (IOCSR chain), two PLLs (PLL0 and PLL1), a master DPRIO (DPRIO_0), a slave DPRIO (DPRIO_1), first and second multiplexers (1502 and 1504, respectively) which receives control bits from the two DPRIO circuits, a third multiplexer 1506 which receives VCO output signals from the two PLLs, and post-scale divide counters (C-Counters). The simplified diagram presented in FIG. 15 shows select components of the circuitry for purposes of describing certain aspects of the dynamic reconfiguration of the fracture-able PLL.

Programming is performed by transmitting configuration bits via the IOCSR chain. The master DPRIO may be arranged to control all reconfigurable bits, while the slave DPRIO may be arranged to control only the reconfigurable bits for PLL1 and for the C-Counters.

The fracture-able PLL may be configured as a single PLL. The clock output may be switched between the VCOs of PLL0 and PLL1 dynamically using the third multiplexer 1506, or the two PLLs may be cascaded internally. In this case, the reconfiguration output 1510 of the master DPRIO (DPRIO_0) is selected by the first and second multiplexers 1502 and 1504.

Alternatively, the fracture-able PLL may be configured as two PLLs. In this case, the reconfiguration output 1511 of the slave DPRIO (DPRIO_1) is selected by the first and second multiplexers 1502 and 1504. There are various possible combinations for using the two PLLs, for example: (a) one PLL may be used as a transmission PLL and the other PLL for the FPGA core, (b) one PLL may be used for DPA/SERDES and the other PLL for a memory interface, (c) one PLL may be for a memory interface and the other PLL for the FPGA core, (d) both PLLs may be used as transmission PLLs, (e) both PLLs may be used for the FPGA core, (f) both PLLs may be used for DPA/SERDES, and (g) both PLLs may be used for the FPGA core.

In one embodiment, each of the PLLs of a fracture-able PLL is an integer PLL. In an alternate embodiment, each of the PLLs of a fracture-able PLL may be modified so as to operate in either an integer mode or a fractional mode.

In the above description, numerous specific details are given to provide a thorough understanding of embodiments of the invention. However, the above description of illustrated embodiments of the invention is not intended to be exhaustive or to limit the invention to the precise forms disclosed. One skilled in the relevant art will recognize that the invention can be practiced without one or more of the specific details, or with other methods, components, etc.

In other instances, well-known structures or operations are not shown or described in detail to avoid obscuring aspects of the invention. While specific embodiments of, and examples for, the invention are described herein for illustrative purposes, various equivalent modifications are possible within the scope of the invention, as those skilled in the relevant art will recognize. These modifications may be made to the invention in light of the above detailed description.

ADDITIONAL EMBODIMENTS

Additional Embodiment 1

A fracture-able phase-locked loop circuit comprising:
a first phase-locked loop circuit generating a first frequency output;
a second phase-locked loop circuit arranged to generate a second frequency output
a plurality of shared output resources; and
configurable circuitry arranged so that either of the first and second frequency outputs is receivable by each of the plurality of shared output resources.

Additional Embodiment 2

The fracture-able phase-locked loop circuit of additional embodiment 1, further comprising:
a shared power source for the first and second phase-locked loop circuits.

Additional Embodiment 3

The fracture-able phase-locked loop circuit of additional embodiment 1, wherein the shared output resources include output counters.

Additional Embodiment 4

The fracture-able phase-locked loop circuit of additional embodiment 1, wherein the shared output resources include at least fourteen shared output counters.

Additional Embodiment 5

The fracture-able phase-locked loop circuit of additional embodiment 1, wherein the shared output resources include low-voltage differential signal system circuitry.

Additional Embodiment 6

The fracture-able phase-locked loop circuit of additional embodiment 1, wherein the shared output resources include dynamic phase aligners.

Additional Embodiment 7

The fracture-able phase-locked loop circuit of additional embodiment 1, wherein the shared output resources include memory interface system circuitry.

Additional Embodiment 8

The fracture-able phase-locked loop circuit of additional embodiment 1, further comprising:
clock input circuitry including clock-lost-detect and switch-over circuitry.

Additional Embodiment 9

The fracture-able phase-locked loop circuit of additional embodiment 1, further comprising:
circuitry to allow each phase-locked loop circuit to be configured into either an integer phase-locked loop or a fractional phase-locked loop.

Additional Embodiment 10

An integrated circuit comprising:
a plurality of physical media attachment (PMA) modules, each PMA module including a plurality of clock data recovery (CDR) circuits which are arranged to receive a plurality of serial data signals and to output data from those signals in parallel form;
a plurality of multiple-purpose phase-locked loop (PLL) circuits; and
a programmable clock network which is arranged to allow the clock signals output by the multiple-purpose PLL circuits to be selectively used either by the PMA modules for a transceiver application or by other circuitry for a non-transceiver application.

Additional Embodiment 11

The integrated circuit of additional embodiment 10, wherein each PMA module is a PMA triplet module having three CDR circuits to support three serial data channels.

Additional Embodiment 12

The integrated circuit of additional embodiment 11, wherein each PMA triplet module has an adjacent multiple-purpose PLL circuit.

Additional Embodiment 13

The integrated circuit of additional embodiment 12, further comprising:
circuitry arranged such that each pair of multiple-purpose PLL circuits forms a fracture-able PLL circuit.

Additional Embodiment 14

The integrated circuit of additional embodiment 10, wherein use by a PMA module of a clock signal output by a multiple-purpose PLL circuit allows the PMA module to support an additional independent channel.

Additional Embodiment 15

The integrated circuit of additional embodiment 14, wherein the multiple-purpose PLL circuits include a voltage-controlled oscillator with an operating frequency sufficiently high to support a 3.75 Gbps data rate.

Additional Embodiment 16

An integrated circuit comprising:
a plurality of physical media attachment (PMA) modules, each PMA module including a plurality of clock data recovery (CDR) circuits and being arranged to receive a plurality of serial data signals and to output data from those signals in parallel form;
a plurality of multiple-purpose phase-locked loop (PLL) circuits;
a plurality of reference clock signal inputs; and
a programmable clock network which is arranged to allow the reference clock signals to be selectively shared by the PMA modules and the multiple-purpose PLL circuits.

Additional Embodiment 17

The integrated circuit of additional embodiment 16, wherein each reference clock signal input is located adjacent to a multiple-purpose PLL circuit.

Additional Embodiment 18

The integrated circuit of additional embodiment 17, wherein each reference clock signal input is further located adjacent to a PMA module.

Additional Embodiment 19

The integrated circuit of additional embodiment 18, wherein each PMA module is a PMA triplet module having three CDR circuits to support three serial data channels.

Additional Embodiment 20

The integrated circuit of additional embodiment 16, wherein the programmable clock network is further arranged to allow clock signals output by the multiple-purpose PLL circuits to be selectively used either by the PMA modules for a transceiver application or by other circuitry for a non-transceiver application.

Additional Embodiment 21

The integrated circuit of additional embodiment 20, further comprising:
circuitry arranged such that each pair of multiple-purpose PLL circuits forms a fracture-able PLL circuit.

Additional Embodiment 22

The integrated circuit of additional embodiment 16, wherein the programmable clock network comprises a bus which is arranged to selectively distribute the reference clock signals to the PLLs and the PMA modules.

Additional Embodiment 23

The integrated circuit of additional embodiment 16, further comprising:
a plurality of low-jitter clock-generator PLLs,
wherein said bus is also arranged to selectively distribute the reference clock signals to the low-jitter clock-generator PLLs.

Additional Embodiment 24

A method of distributing clock signals in an integrated circuit, the method comprising:
generating a first frequency output by a first phase-locked loop circuit;
generating a second frequency output by a second phase-locked loop circuit; and
selectively distributing the first and second frequency outputs to a plurality of shared output resources.

Additional Embodiment 25

The method of additional embodiment 24, further comprising providing power to the first and second phase-locked loop circuits from a shared power source.

Additional Embodiment 26

The method of additional embodiment 24, wherein the shared output resources include output counters.

Additional Embodiment 27

The method of additional embodiment 24, wherein the shared output resources include at least fourteen shared output counters.

Additional Embodiment 28

The method of additional embodiment 24, wherein the shared output resources include low-voltage differential signal system circuitry.

Additional Embodiment 29

The method of additional embodiment 24, wherein the shared output resources include dynamic phase aligners.

Additional Embodiment 30

The method of additional embodiment 24, wherein the shared output resources include memory interface system circuitry.

Additional Embodiment 31

A method of providing clock signals for multiple purposes in an integrated circuit, the method comprising:
  generating a plurality of clock signals by a plurality of multiple-purpose phase-locked loop (PLL) circuits;
  selectively distributing the clock signals output by the multiple-purpose PLL circuits to physical media attachment (PMA) modules arranged at a side of the integrated circuit and to logic circuitry arranged in a core section of the integrated circuit; and
  using the clock signals by circuitry in the PMA modules for supporting a plurality of data communications channels.

Additional Embodiment 32

The method of additional embodiment 31, wherein each PMA module is a PMA triplet module having three CDR circuits to support three serial data channels.

Additional Embodiment 33

The method of additional embodiment 32, wherein each PMA triplet module has an adjacent multiple-purpose PLL circuit.

Additional Embodiment 34

The method of additional embodiment 31, wherein use by a PMA module of a clock signal output by a multiple-purpose PLL circuit allows the PMA module to support an additional independent data communication channel.

Additional Embodiment 35

The method of additional embodiment 34, wherein the multiple-purpose PLL circuits include a voltage-controlled oscillator with an operating frequency sufficiently high to support a 3.75 Gbps data rate.

Additional Embodiment 36

A method of utilizing reference clock signals in an integrated circuit, the method comprising:
  receiving a plurality of reference clock signal inputs;
  distributing the reference clock signals to physical media attachment (PMA) modules and to a plurality of multiple-purpose PLL circuits located adjacent to the PMA modules;
  using the reference clock signals by clock data recovery (CDR) circuits in the PMA modules to receive a plurality of serial data signals and to output data from those signals in parallel form; and
  using the reference clock signals by the multiple-purpose PLL circuits as reference frequency signals.

Additional Embodiment 37

The method of additional embodiment 36, wherein each PMA module is a PMA triplet module having three CDR circuits to support three serial data channels.

Additional Embodiment 38

The method of additional embodiment 36, further comprising selectively distributing clock signals output by the multiple-purpose PLL circuits to the PMA modules.

Additional Embodiment 39

The method of additional embodiment 36, further comprising selectively distributing the reference clock signals to low-jitter clock-generator PLL circuits located adjacent to the PMA modules on a side opposite from the multiple-purpose PLL circuits.

What is claimed is:

1. An integrated circuit comprising:
  a first strip of phase-locked loop (PLL) circuits on a first side of the integrated circuit;
  a second strip of PLL circuits on a second side of the integrated circuit, wherein the second side is opposite from the first side;
  a first physical media attachment (PMA) module strip on the first side of the integrated circuit; and
  a second PMA module strip on the second side of the integrated circuit,
  wherein the first and second PMA module strips comprise PMA triplet modules, and wherein there is a pitch of one PMA triplet module in a PMA module strip per PLL in a PLL strip.

2. The integrated circuit of claim 1, further comprising:
  a first plurality of power input contacts on the first side of the integrated circuit;
  a first power distribution network arranged to distribute power from the first plurality of power input contacts to the first strip of PLL circuits;
  a second plurality of power input contacts on the second side of the integrated circuit; and
  a second power distribution network arranged to distribute power from the second plurality of power input contacts to the second strip of PLL circuits.

3. The integrated circuit of claim 1, wherein the first and second strips of PLL circuits comprise fracture-able PLL modules.

4. The integrated circuit of claim 3, wherein a fracture-able PLL module comprises:
  a first PLL;
  a second PLL; and
  reconfigurable input/output circuitry coupled to the first and second PLLs.

5. The integrated circuit of claim 1, further comprising:
  a first low-jitter clock-generation PLL (LC PLL) strip on the first side of the integrated circuit; and
  a second LC PLL strip on the second side of the integrated circuit,
  wherein there is a pitch of one LC PLL circuit per PMA triplet module.

6. The integrated circuit of claim 5, further comprising:
  a reference clock source associated with each PMA triplet module, wherein each reference clock source generates a reference clock signal; and
  a programmable clock network arranged on the first side to selectively distribute reference clock signals between the first strip of PLL circuits, the first PMA module strip, and the first LC PLL strip; and
  a programmable clock network arranged on the second side to selectively distribute reference clock signals between the second strip of PLL circuits, the second PMA module strip, and the second LC PLL strip.

7. The integrated circuit of claim 5, further comprising:
  a programmable clock network arranged on the first side to allow the PMA triplet modules to selectively drive the PLLs in the first strip of PLL circuits; and a programmable clock network arranged on the second side to allow the PMA triplet modules to selectively drive the Pas in the second strip of PLL circuits.

8. The integrated circuit of claim 5, further comprising:
a programmable clock network arranged on the first side to selectively allow each PLL in the first strip of PLL circuits to be used as a transmission PLL for a channel on an adjacent PMA triplet module or for a channel on a PMA triplet module neighboring the adjacent PMA triplet module; and
a programmable clock network arranged on the second side to selectively allow each PLL of in the second strip of PLL circuits to be used as a transmission PLL for a channel on an adjacent PMA triplet module or for a channel on a PMA triplet module neighboring the adjacent PMA triplet module.

9. The integrated circuit of claim 1, further comprising:
a field programmable gate array core positioned in between the first and second strips of PLL circuits.

10. An integrated circuit comprising:
a first strip of phase-locked loop (PLL) circuits on a first side of the integrated circuit;
a second strip of PLL circuits on a second side of the integrated circuit, wherein the second side is opposite from the first side; and
fracture-able PLL modules in the first and second strips, wherein a fracture-able PLL module comprises a first PLL, a second PLL and reconfigurable input/output circuitry coupled to the first and second PLLs, wherein the reconfigurable input/output circuitry includes a master circuit which is arranged to control reconfigurable bits for both the first and second PLLs, and a slave circuit which is arranged to control reconfigurable bits for the second PLL.

11. The integrated circuit of claim 10, further comprising:
a first physical media attachment (PMA) module strip on the first side of the integrated circuit; and
a second PMA module strip on the second side of the integrated circuit.

12. The integrated circuit of claim 11, wherein the first and second PMA module strips comprise PMA triplet modules, and wherein there is a pitch of one PMA triplet module in a PMA module strip per PLL in a PLL strip.

13. An integrated circuit comprising:
a first strip of phase-locked loop (PLL) circuits on a first side of the integrated circuit;
a second strip of PLL circuits on a second side of the integrated circuit, wherein the second side is opposite from the first side;
a first physical media attachment (PMA) module strip on the first side of the integrated circuit;
a second PMA module strip on the second side of the integrated circuit; and
band gap circuitry which is arranged to be shared by a strip of PLL circuits and a PMA module strip.

14. An integrated circuit comprising:
a first strip of phase-locked loop (PLL) circuits on a first side of the integrated circuit;
a second strip of PLL circuits on a second side of the integrated circuit, wherein the second side is opposite from the first side;
a first physical media attachment (PMA) module strip on the first side of the integrated circuit;
a second PMA module strip on the second side of the integrated circuit; and
analog test bus circuitry which is arranged to be shared by a strip of PLL circuits and a PMA module strip.

15. A method of distributing clock signals in an integrated circuit, the method comprising:
generating a first plurality of clock outputs from a first strip of phase-locked loop (PLL) circuits on a first side of the integrated circuit;
generating a second plurality of clock outputs from a second strip of PLL circuits on a second side of the integrated circuit, wherein the first and second sides are opposing sides of the integrated circuit;
selectively distributing the first plurality of clock outputs to a first strip of physical media attachment (PMA) circuits on the first side and to core circuitry between the first and second sides;
selectively distributing the second plurality of clock outputs to a second strip of PMA circuits on the second side and to the core circuitry;
supplying power to the first plurality of PLL circuits by way of a first plurality of power input contacts and a first power distribution network on the first side of the integrated circuit; and
supplying power to the second plurality of PLL circuits by way of a second plurality of power input contacts and a second power distribution network on the second side of the integrated circuit.

16. The method of claim 15, wherein the first and second strips of PLL circuits comprise fracture-able PLL modules, further comprising:
configuring the fracture-able PLL modules in the first and second strips of PLL circuits using dynamic partial reconfigurable input/output (DPRIO) circuitry.

17. An integrated circuit comprising:
a plurality of phase-locked loop (PLL) circuits;
a plurality of physical media attachment (PMA) triplet modules adjacent to the plurality of PLL circuits;
a first channel of each PMA triplet module, wherein the first channel is arranged for use as a receiving channel;
a second channel of each PMA triplet module, wherein the second channel is arranged to be configurable as either a receiving channel or a clock multiplication unit;
a third channel of each PMA triplet module, wherein the third channel is arranged for use as a receiving channel;
a plurality of reference clock sources generating a plurality of reference clock signals; and
a clock network arranged to distribute the reference clock signals between the plurality of PMA triplet modules and the PLL circuits.

18. The integrated circuit of claim 17, further comprising:
a programmable clock network arranged to allow the PMA triplet modules to selectively drive the PLL circuits.

19. The integrated circuit of claim 17, further comprising:
a programmable clock network arranged to allow each PLL circuit of the plurality of PLL circuits to be used as a transmission PLL for a channel on an adjacent PMA triplet module.

20. The integrated circuit of claim 19, wherein the programmable clock network is further arranged to allow each PLL circuit of the plurality of PLL circuits to be used as a transmission PLL for a channel on a PMA triplet module which is a neighbor to the adjacent PMA triplet module.

* * * * *